United States Patent
Kikkawa

(10) Patent No.: US 9,412,812 B2
(45) Date of Patent: Aug. 9, 2016

(54) COMPOUND SEMICONDUCTOR DEVICE AND METHOD OF MANUFACTURING THE SAME

(71) Applicant: FUJITSU LIMITED, Kawasaki-shi (JP)

(72) Inventor: Toshihide Kikkawa, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/845,033

(22) Filed: Mar. 17, 2013

(65) Prior Publication Data

US 2013/0256829 A1   Oct. 3, 2013

(30) Foreign Application Priority Data

Mar. 29, 2012   (JP) .................................. 2012-077192

(51) Int. Cl.

| | |
|---|---|
| *H01L 21/70* | (2006.01) |
| *H01L 29/06* | (2006.01) |
| *H01L 21/76* | (2006.01) |
| *H01L 29/423* | (2006.01) |
| *H01L 29/66* | (2006.01) |
| *H01L 29/778* | (2006.01) |
| *H01L 21/28* | (2006.01) |
| *H01L 21/762* | (2006.01) |
| *H01L 21/02* | (2006.01) |

(Continued)

(52) U.S. Cl.
CPC ...... *H01L 29/0649* (2013.01); *H01L 21/28264* (2013.01); *H01L 21/76* (2013.01); *H01L 21/76229* (2013.01); *H01L 29/4236* (2013.01); *H01L 29/66462* (2013.01); *H01L 29/7787* (2013.01); *H01L 21/02178* (2013.01); *H01L 21/02318* (2013.01); *H01L 29/2003* (2013.01); *H01L 29/517* (2013.01); *H01L 29/518* (2013.01)

(58) Field of Classification Search
USPC ................... 257/500, 506, 510; 438/424, 426
See application file for complete search history.

(56) References Cited

U.S. PATENT DOCUMENTS

| | | | | |
|---|---|---|---|---|
| 6,037,238 | A  * | 3/2000 | Chang et al. ................... | 438/426 |
| 8,703,567 | B2 * | 4/2014 | Wang et al. .................... | 438/287 |
| 2007/0045631 | A1 * | 3/2007 | Endo et al. ....................... | 257/77 |

(Continued)

FOREIGN PATENT DOCUMENTS

| | | |
|---|---|---|
| CN | 101960576 | 1/2011 |
| JP | 2010-219247 | 9/2010 |

(Continued)

OTHER PUBLICATIONS

KROA—Office Action of Korean Patent Application No. 10-2013-33309 dated Jul. 28, 2014 with English translation of the Office Action.

(Continued)

*Primary Examiner* — Errol Fernandes
(74) *Attorney, Agent, or Firm* — Fujitsu Patent Center

(57) ABSTRACT

An AlGaN/GaN HEMT includes a compound semiconductor stack structure; an element isolation structure which demarcates an element region on the compound semiconductor stack structure; a first insulating film which is formed on the element region and is not formed on the element isolation structure; a second insulating film which is formed on at least the element isolation structure and is higher in hydrogen content than the first insulating film; and a gate electrode which is formed on the element region of the compound semiconductor stack structure via the second insulating film.

7 Claims, 26 Drawing Sheets

(51) Int. Cl.
 *H01L 29/20* (2006.01)
 *H01L 29/51* (2006.01)

(56) References Cited

U.S. PATENT DOCUMENTS

| | | | |
|---|---|---|---|
| 2008/0096388 A1* | 4/2008 | Matsumoto | C09G 1/02 |
| | | | 438/689 |
| 2008/0157266 A1* | 7/2008 | Chen et al. | 257/510 |
| 2011/0042719 A1 | 2/2011 | Sazawa et al. | |
| 2011/0309451 A1* | 12/2011 | Tsukamoto | 257/369 |
| 2012/0049180 A1* | 3/2012 | Yamada | 257/43 |
| 2012/0319215 A1* | 12/2012 | Wang et al. | 257/410 |
| 2014/0054699 A1* | 2/2014 | Liu et al. | 257/347 |
| 2014/0131720 A1* | 5/2014 | Hsiung et al. | 257/76 |

FOREIGN PATENT DOCUMENTS

| | | |
|---|---|---|
| KR | 10-2007-0026173 | 3/2007 |
| TW | 200950081 | 12/2009 |

OTHER PUBLICATIONS

U.S. Pat. No. 6,037,238 cited in the above listed Korean Office Action was previously cited by the Examiner on Jun. 20, 2014.
TWOA—Office Action of Taiwanese Patent Application 102109436 dated Dec. 8, 2014, with English translation of the relevant part, summary of the Office Action.
CNOA—Office Action of Chinese Patent Application No. 201310100368.0 dated May 28, 2015, with English translation of the relevant part.

\* cited by examiner

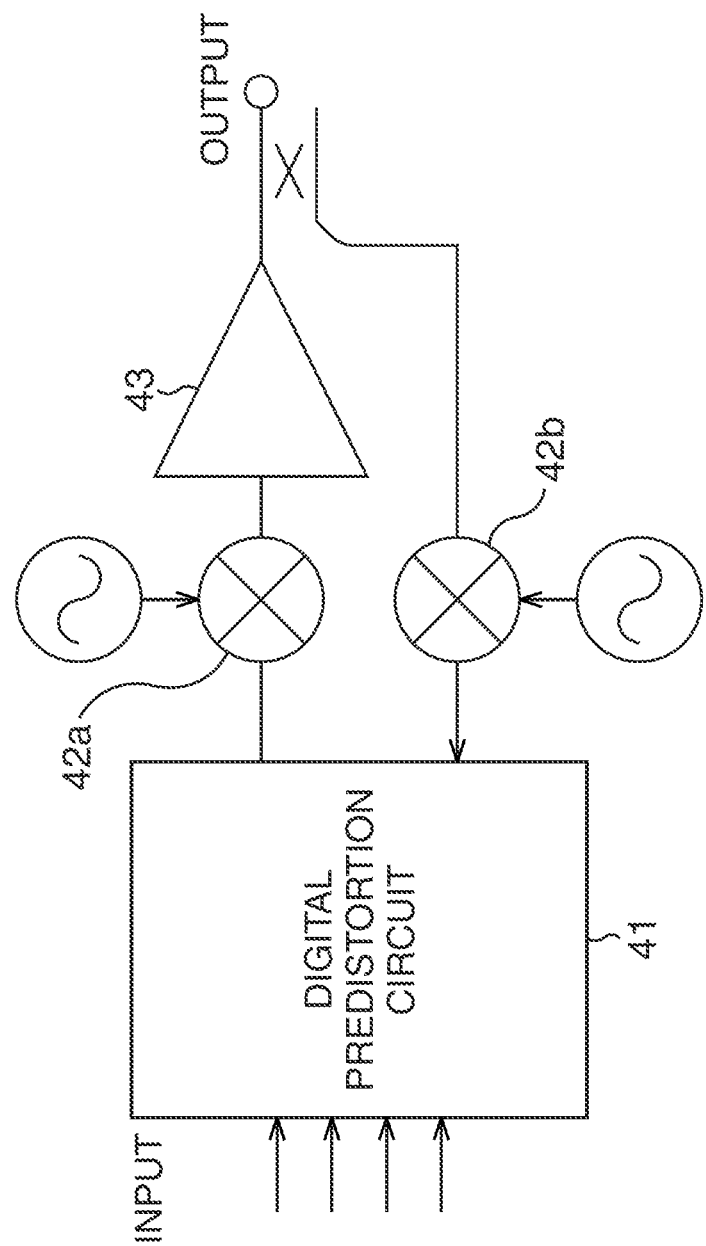

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-077192, filed on Mar. 29, 2012, the entire contents of which are incorporated herein by reference.

FIELD

The embodiments discussed herein are directed to a compound semiconductor device and a method of manufacturing the same.

BACKGROUND

It has been considered to apply nitride semiconductors to high-withstand-voltage, high-power semiconductor devices by utilizing their characteristics such as a high saturation electron velocity and a wide band gap. For example, GaN being a nitride semiconductor has a band gap of 3.4 eV, which is higher than a band gap of Si (1.1 eV) and a band gap of GaAs (1.4 eV), and has high breakdown electric field intensity. This makes GaN very promising as a material of semiconductor devices for power supply realizing a high voltage operation and a high power.

Many reports have been made on field-effect transistors, in particular, HEMT (High Electron Mobility Transistor) as devices using nitride semiconductors. For example, among GaN-based HEMT (GaN-HEMT), an AlGaN/GaN HEMT using GaN as an electron transit layer and using AlGaN as an electron supply layer has been drawing attention. In the AlGaN/GaN HEMT, a distortion ascribable to a difference in lattice constant between GaN and AlGaN occurs in AlGaN. Owing to piezoelectric polarization caused by the distortion and spontaneous polarization of AlGaN, high-concentration two-dimensional electron gas (2DEG) is obtained. Therefore, the AlGaN/GaN HEMT is expected as a high-efficiency switch element or a high withstand voltage, high power device for electric vehicles and the like.

[Patent Document 1] Japanese Laid-open Patent Publication No. 2010-219247

In a nitride semiconductor device, a protection film is often formed through the deposition of an insulator covering a nitride semiconductor layer. In some case, what is called a MIS-type HEMT is formed with this protection film used as a gate insulating film. In the case where the protection film is formed, high-temperature annealing is applied to the protection film after its formation to improve its insulating film quality.

However, there has been found a problem that the high-temperature annealing, though improving the insulating film quality of the protection film, increases an off-leakage current in the nitride semiconductor device.

FIG. 1 is a characteristic chart illustrating a correlation of the off-leakage current with drain voltage in an AlGaN/GaN HEMT having a protection film. The protection film was formed by an ALD method (Atomic Layer Deposition method) with aluminum oxide used as a material. When a processing temperature is low (for example, 600° C.), there is almost no problem of the off-leakage current. On the other hand, when the processing temperature is high temperature (for example, 720° C.) at which the insulating film quality of the protection film significantly improves, it has been found out that the off-leakage current increases in accordance with an increase in the drain voltage.

SUMMARY

A compound semiconductor device according to an aspect includes: a compound semiconductor region; an element isolation structure which demarcates an element region on the compound semiconductor region; a first insulating film which is formed on the element region and is not formed on the element isolation structure; and a second insulating film which is formed on at least the element isolation structure and is higher in hydrogen content than the first insulating film.

A method of manufacturing a semiconductor device according to an aspect includes: forming, on a compound semiconductor region, a first insulating film which has an opening on an element isolation region and covers an element region; forming an element isolation structure on the element isolation region; and forming a second insulating film which covers at least the element isolation structure and is higher in hydrogen content than the first insulating film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 28 is a connection diagram illustrating a schematic structure of a high-frequency amplifier according to a fifth embodiment.

DESCRIPTION OF EMBODIMENTS

Hereinafter, embodiments will be described in detail with reference to the drawings. In the following embodiments, structures of compound semiconductor devices will be described together with methods of manufacturing the same.

Note that in the following drawings, some constituent members are not illustrated with accurate relative size and thickness for convenience of the illustration.

First Embodiment

In this embodiment, a MIS-type AlGaN/GaN HEMT will be disclosed as the compound semiconductor device.

FIG. 2 to FIG. 12 are schematic cross-sectional views illustrating a method of manufacturing the MIS-type AlGaN/GaN HEMT according to the first embodiment in order of steps.

Figure 1:
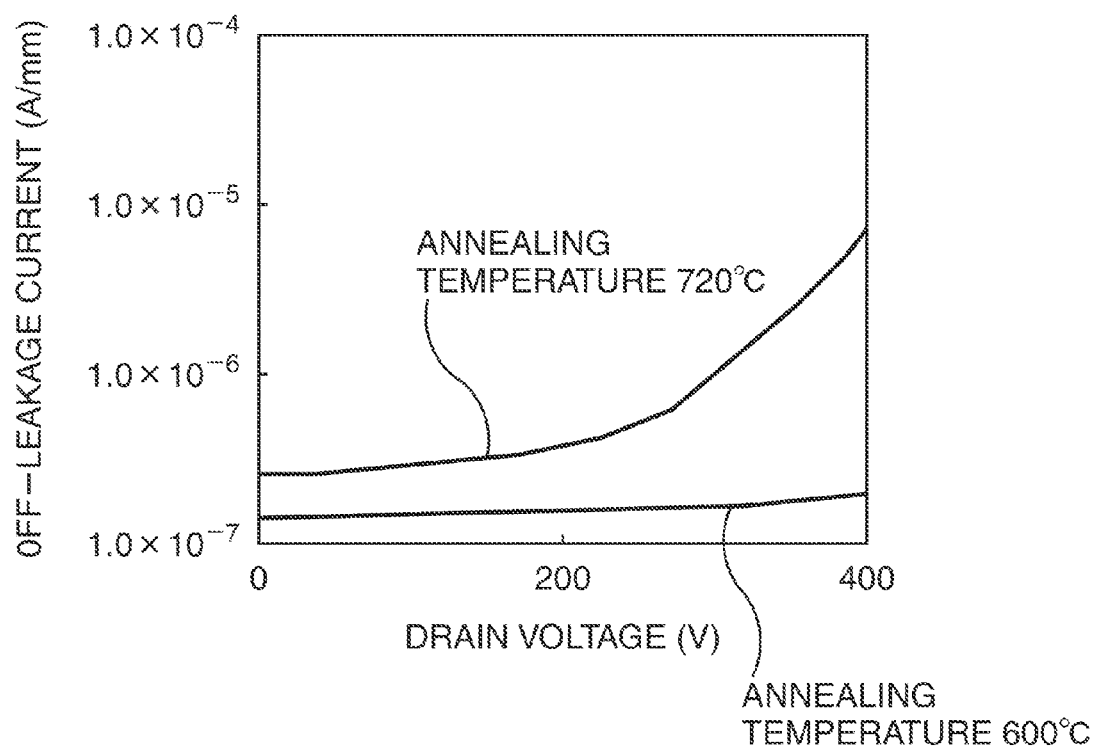
FIG. 1 is a characteristic chart illustrating a correlation of an off-leakage current with drain voltage in an AlGaN/GaN HEMT having a protection film.
Figure 2:
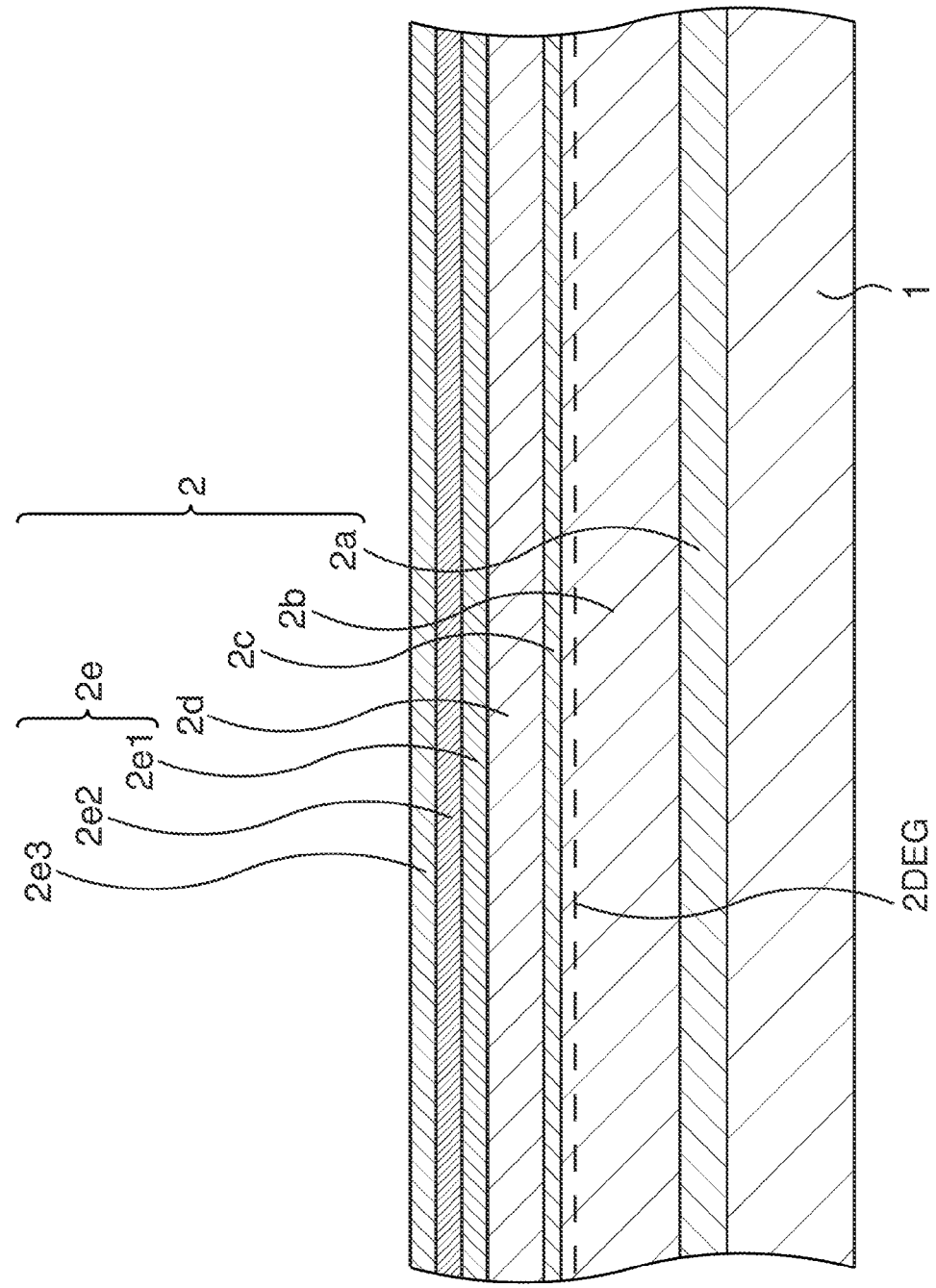
FIG. 2 is a schematic cross-sectional view illustrating a method of manufacturing a MIS-type AlGaN/GaN HEMT according to a first embodiment in order of steps.

First, as illustrated in FIG. 2, a compound semiconductor region, here, a compound semiconductor stack structure 2 is formed on, for example, a Si substrate 1 as a growth substrate. Instead of the Si substrate, a SiC substrate, a sapphire substrate, a GaAs substrate, a GaN substrate, or the like may be used as the growth substrate. Further, conductivity of the substrate may be either semi-insulative or conductive.

The compound semiconductor stack structure 2 includes a nucleus formation layer 2a, an electron transit layer 2b, an intermediate layer (spacer layer) 2c, an electron supply layer 2d, and a cap layer 2e. The cap layer 2e has a three-layer structure and is composed of a first cap 2e1, a second cap 2e2, and a third cap 2e3 which are stacked in sequence.

In more detail, the following compound semiconductors are grown on the Si substrate 1 by, for example, a MOVPE (Metal Organic Vapor Phase Epitaxy) method. Instead of the MOVPE method, a MBE (Molecular Beam Epitaxy) method or the like may be used.

On the Si substrate 1, the compound semiconductors that are to be the nucleus formation layer 2a, the electron transit layer 2b, the intermediate layer 2c, the electron supply layer 2d, and the cap layer 2e are grown in sequence. The nucleus formation layer 2a is formed of AlN grown on the Si substrate 1 with a thickness of, for example, about 0.1 µm. The electron transit layer 2b is formed of i (intentionally undoped)-GaN grown with a thickness of, for example, 3 µm. The intermediate layer 2c is formed of i-AlGaN grown with a thickness of, for example, about 5 nm. The electron supply layer 2d is formed of n-AlGaN grown with a thickness of about 30 nm. In forming the cap layer 2e, n-GaN is grown with, for example, 7 nm as the first cap 2e1, AlN is grown with, for example, about 2 nm as the second cap 2e2, and n-GaN is grown with, for example, about 4 nm as the third cap 2e3. The intermediate layer 2c is not sometimes formed. The electron supply layer 2d may be formed of i-AlGaN.

To grow GaN, mixed gas of trimethylgallium (TMGa) gas being a Ga source and ammonia ($NH_3$) gas is used as a source gas. To grow AlGaN, mixed gas of trimethylaluminum (TMAl) gas, TMGa gas, and $NH_3$ gas is used as a source gas. According to the compound semiconductor layer to be grown, whether or not to supply the TMAl gas and the TMGa gas and flow rates are appropriately set. The flow rate of the $NH_3$ gas being a common source is set to about 100 sccm to about 10 slm. Further, growth pressure is set to about 50 Torr to about 300 Torr, and growth temperature is set to about 1000° C. to about 1200° C.

In order to grow AlGaN and GaN as an n-type, that is, in order to form the electron supply layer 2d (n-AlGaN) and the first and third caps 2e1, 2e3 (n-GaN), n-type impurities are added to the source gases of AlGaN and GaN. Here, for example, silane ($SiH_4$) gas containing Si is added to the source gases at a predetermined flow rate, thereby doping AlGaN and GaN with Si. A doping concentration of Si is set to about $1\times10^{18}/cm^3$ to about $1\times10^{20}/cm^3$, for example, set to about $5\times10^{18}/cm^3$.

In the formed compound semiconductor stack structure 2, piezoelectric polarization caused by a distortion ascribable to a difference between a lattice constant of GaN and a lattice constant of AlGaN occurs on an interface of the electron transit layer 2b with the electron supply layer 2d (to be precise, an interface with the intermediate layer 2c. hereinafter, referred to as a GaN/AlGaN interface). Owing to both an effect of the piezoelectric polarization and an effect of spontaneous polarization of the electron transit layer 2b and the electron supply layer 2d, two-dimensional electron gas (2DEG) with high electron concentration is generated in the GaN/AlGaN interface.

Figure 3:
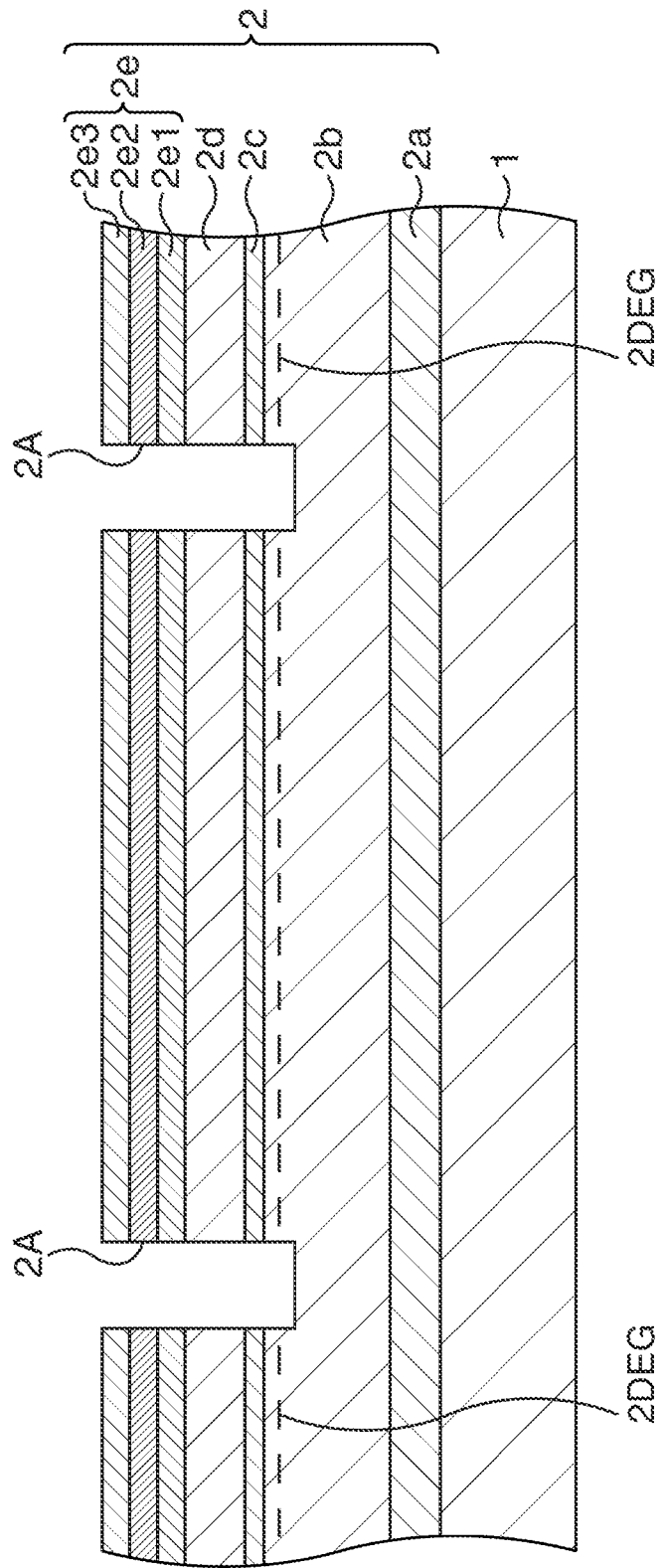
FIG. 3, which is continued from FIG. 2, is a schematic cross-sectional view illustrating the method of manufacturing the MIS-type AlGaN/GaN HEMT according to the first embodiment in order of steps.

Subsequently, as illustrated in FIG. 3, recesses 2A are formed in portions where to form gate electrodes.

In more detail, first, a resist is applied on a surface of the compound semiconductor stack structure 2. The resist is processed by lithography, whereby openings from which portions corresponding to the portions where to form the gate electrodes, of the surface of the compound semiconductor stack structure are exposed are formed in the resist. Consequently, a resist mask having the openings is formed.

By using this resist mask, the compound semiconductor stack structure 2 is dry-etched until a surface layer of the electron transit layer 2b is etched, here, up to an about depth where 2DEG generated in the interface of the electron transit layer 2b is split. Consequently, the recesses 2A from whose bottom surfaces, parts of the etched electron transit layer 2b are exposed are formed in the compound semiconductor stack structure 2. Thus forming the recesses 2A enables what is called a normally-off operation. For the dry etching, inert gas such as Ar and chlorine-based gas such as $Cl_2$ is used as etching gas.

The resist mask is removed by wet processing, asking, or the like.

Figure 4:
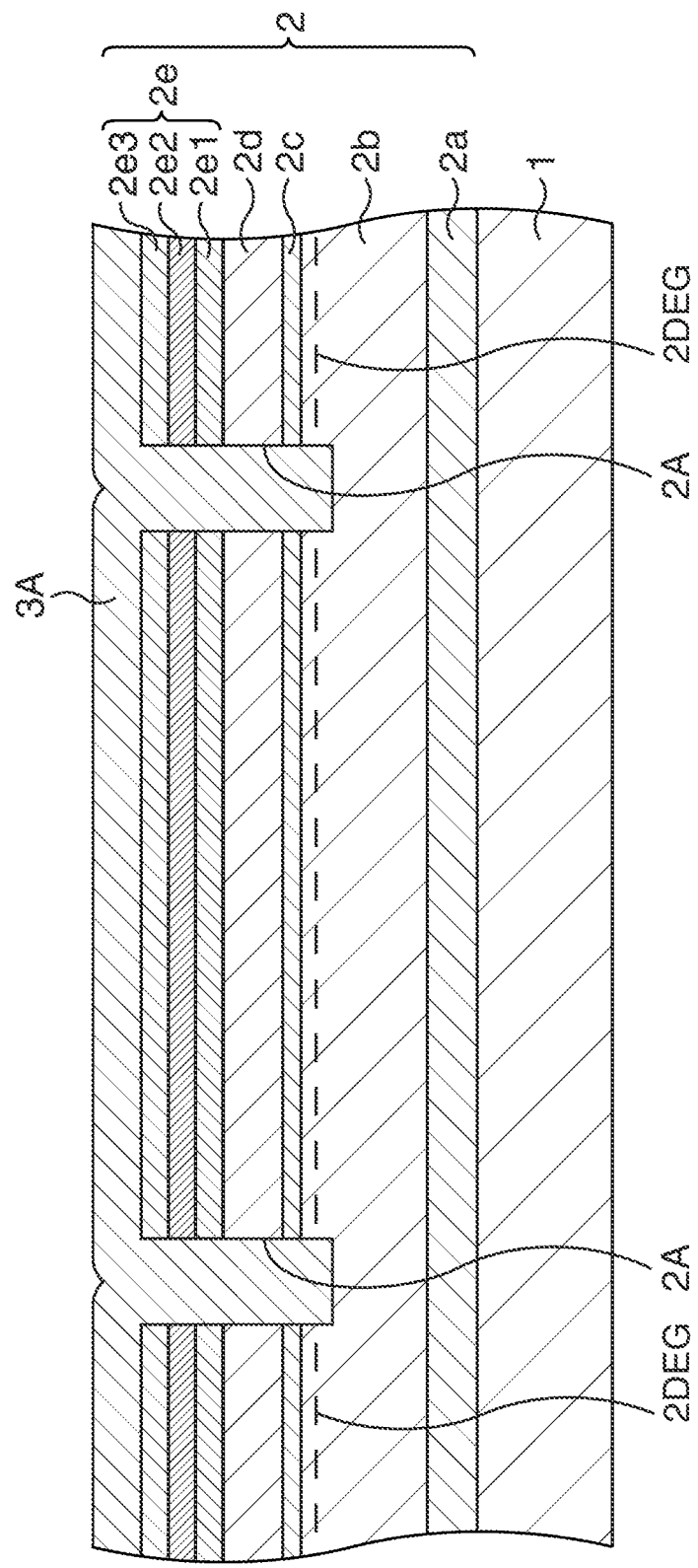
FIG. 4, which is continued from FIG. 3, is a schematic cross-sectional view illustrating the method of manufacturing the MIS-type AlGaN/GaN HEMT according to the first embodiment in order of steps.

Subsequently, as illustrated in FIG. 4, an $Al_2O_3$ film 3A is formed.

In more detail, for example, aluminum oxide ($Al_2O_3$) is deposited on the whole surface of the compound semiconductor stack structure 2 so as to fill the recesses 2A. $Al_2O_3$ is deposited with a film thickness of about 40 nm at a processing temperature of about 300° C. by, for example, the ALD method. Instead of $Al_2O_3$, hafnium oxide ($HfO_2$), aluminum oxynitride (AlON), or tantalum oxide ($Ta_2O_5$) or any combination thereof may be deposited.

Consequently, the $Al_2O_3$ film 3A covering the whole surface of the compound semiconductor stack structure 2 is formed.

Figure 5:
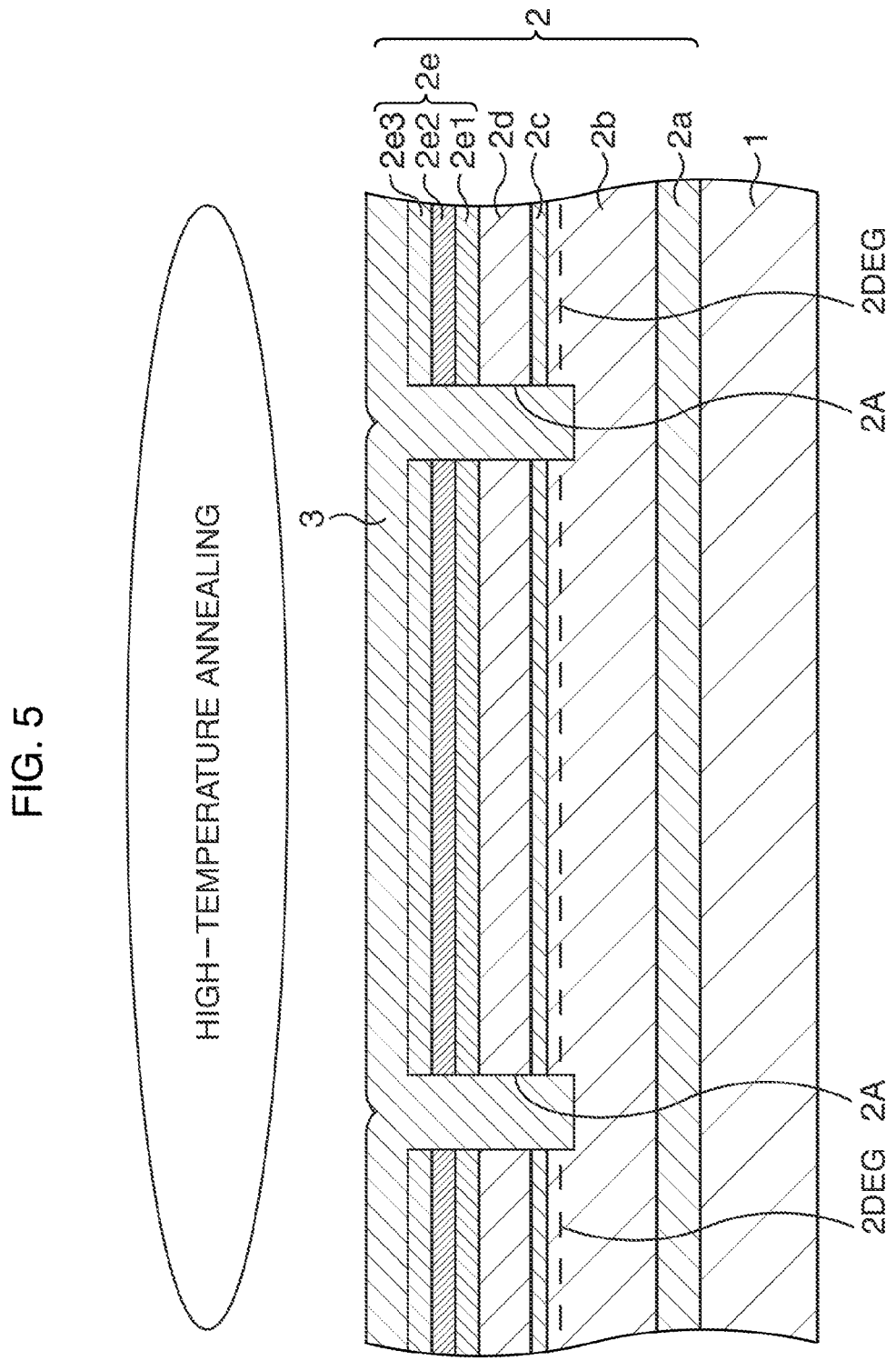
FIG. 5, which is continued from FIG. 4, is a schematic cross-sectional view illustrating the method of manufacturing the MIS-type AlGaN/GaN HEMT according to the first embodiment in order of steps.

Subsequently, as illustrated in FIG. 5, high-temperature annealing is applied to the $Al_2O_3$ film 3A to form a first insulating film 3.

In more detail, the $Al_2O_3$ film 3A is subjected to the one-minute high-temperature annealing at a processing temperature of 700° C. or higher, here, 850° C. which is higher than that of later-described low-temperature annealing. By this high-temperature annealing, the $Al_2O_3$ film 3A is reformed into a film having excellent insulating film quality, with its hydrogen content being lower than a later-described second insulating film. The $Al_2O_3$ film 3A having undergone the high-temperature annealing is the first insulating film 3. The hydrogen content of the first insulating film 3 becomes 1% or less, here about 0.5%. The "hydrogen content" means a ratio of an amount of hydrogen atoms to an amount of Al atoms per unit volume (1 $cm^3$). The hydrogen concentration of the first insulating film 3, as evaluated by a thermal desorption spectrometry method (TDS method), is about $5\times10^{19}/cm^3$ or less, here about $1\times10^{19}/cm^3$.

Figure 6:
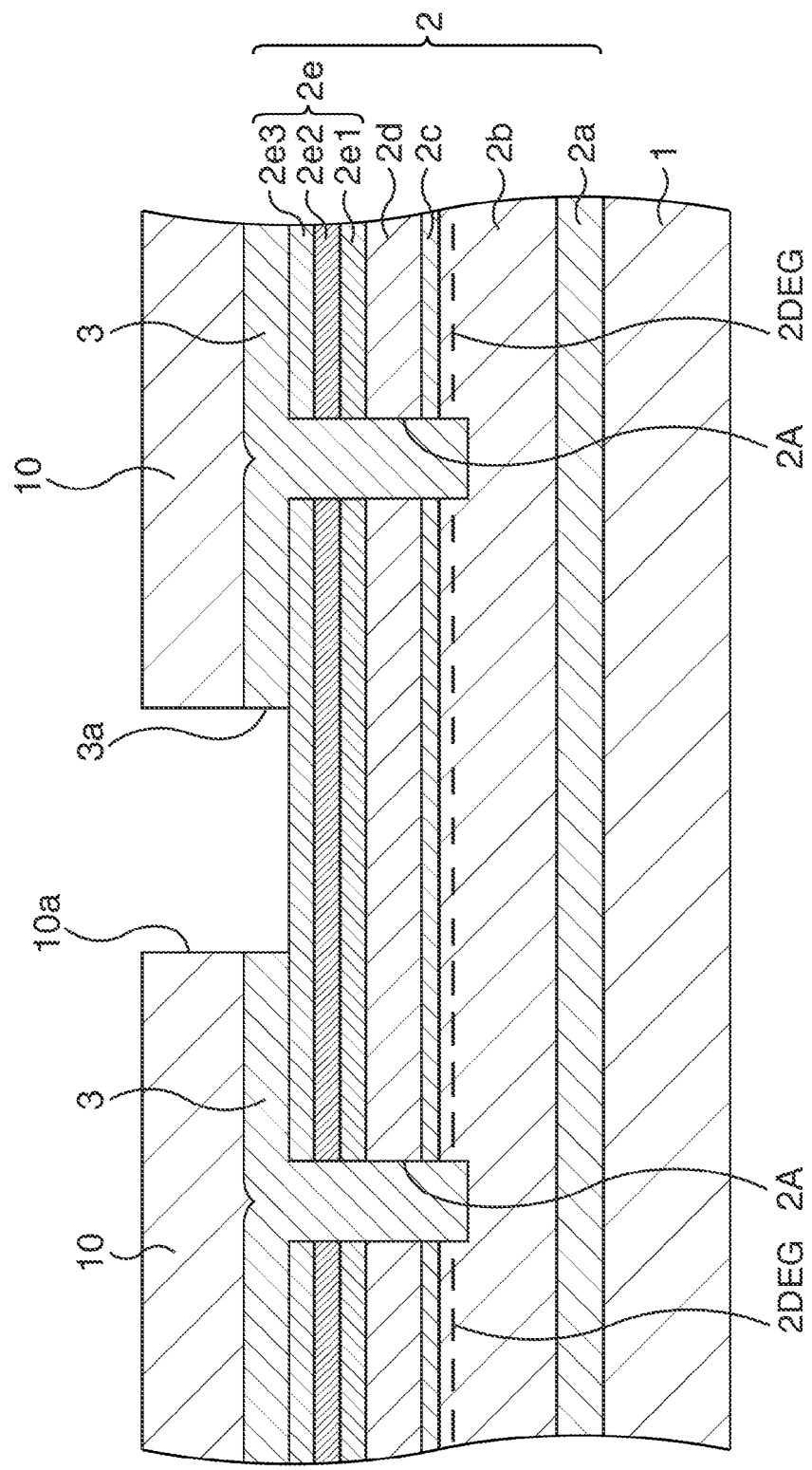
FIG. 6, which is continued from FIG. 5, is a schematic cross-sectional view illustrating the method of manufacturing the MIS-type AlGaN/GaN HEMT according to the first embodiment in order of steps.

Subsequently, as illustrated in FIG. 6, openings 3a are formed in the first insulating film 3.

In more detail, a resist is first applied on the first insulating film 3 and is processed by lithography. Consequently, a resist mask 10 having openings 10a from which element isolation regions (portions where to form element isolation structures) of the first insulating film 3 are exposed is formed.

By using the resist mask 10, the first insulating film 3 is dry-etched. As etching gas, $SF_6$ is used, for instance. Consequently, portions on the element isolation regions, of the first insulating film 3 are removed, whereby the openings 3a from which the element isolation regions are exposed are formed in the first insulating film 3.

Figure 7:
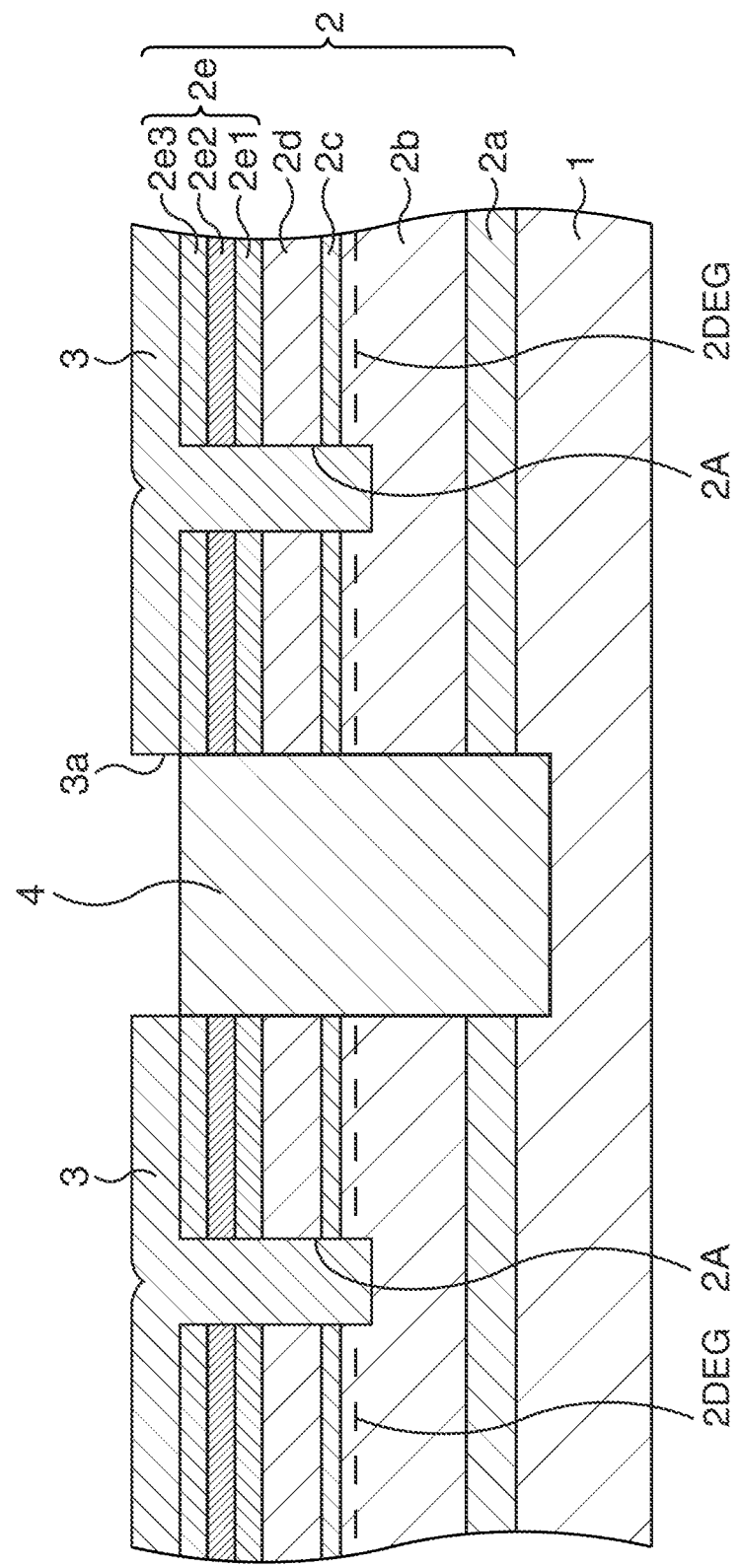
FIG. 7, which is continued from FIG. 6, is a schematic cross-sectional view illustrating the method of manufacturing the MIS-type AlGaN/GaN HEMT according to the first embodiment in order of steps.

Subsequently, as illustrated in FIG. 7, element isolation structures 4 are formed.

In more detail, by using the resist mask 10 again, argon (Ar), for example, is injected to the element isolation regions of the compound semiconductor stack structure 2. An injection condition is such that acceleration energy of Ar is about 40 keV and its dose amount is about $1\times10^{14}/cm^2$. Consequently, the element isolation structures 4 are formed in the compound semiconductor stack structure 2 and a surface layer portion of the Si substrate 1. The element isolation structures 4 demarcate element regions on the compound semiconductor stack structure 2.

Incidentally, for the element isolation, instead of the aforesaid injection method, another known method such as, for example, a STI (Shallow Trench Isolation) method may be used. At this time, for the dry etching of the compound semiconductor stack structure 2, a chlorine-based etching gas is used, for instance.

The resist mask 10 is removed by wet processing, asking, or the like.

Figure 8:
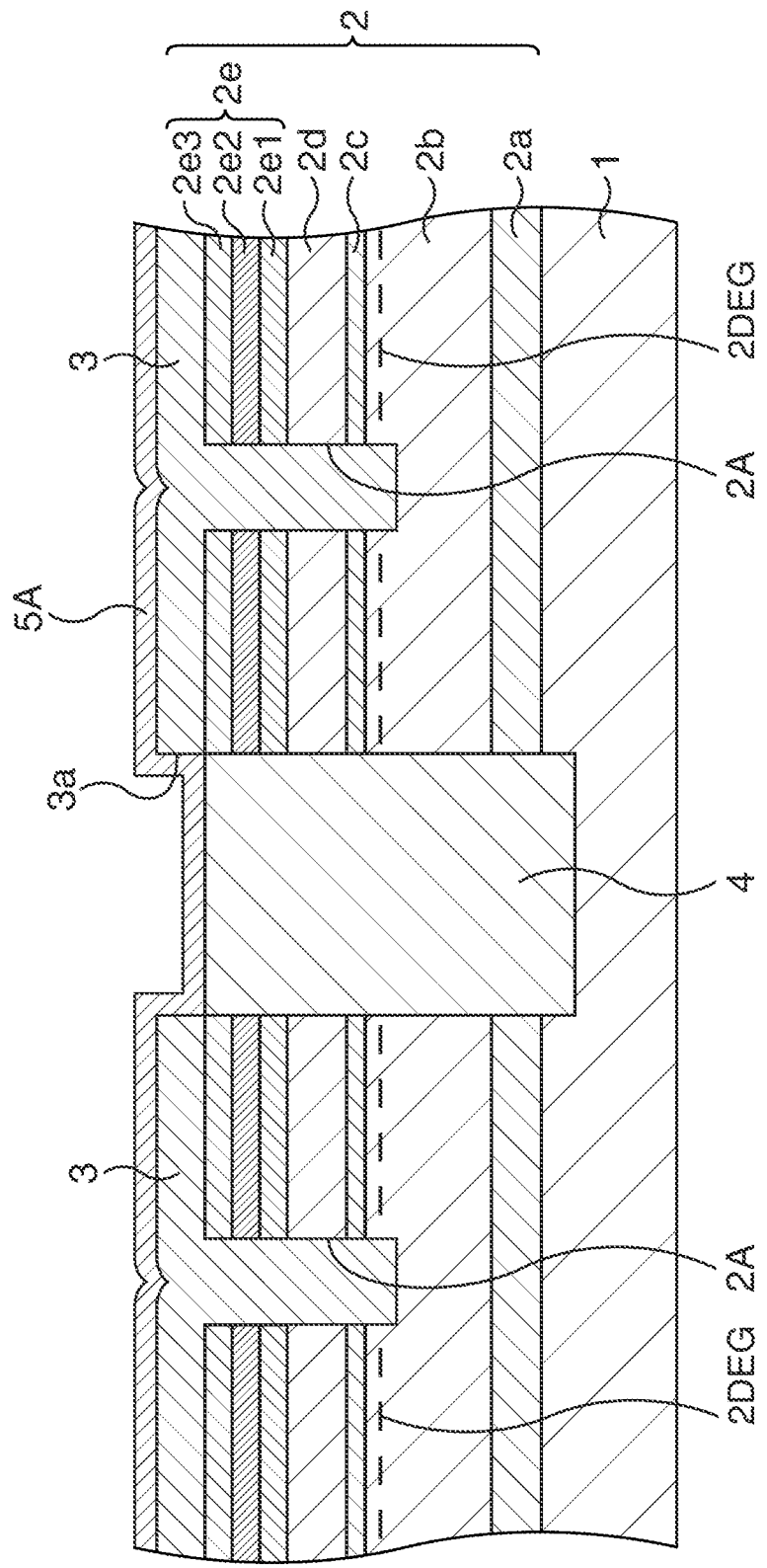
FIG. 8, which is continued from FIG. 7, is a schematic cross-sectional view illustrating the method of manufacturing the MIS-type AlGaN/GaN HEMT according to the first embodiment in order of steps.

Subsequently, as illustrated in FIG. 8, an $Al_2O_3$ film 5A is formed.

In more detail, oxide aluminum ($Al_2O_3$), for example, is deposited on the whole surface of the compound semiconductor stack structure 2 including areas on the element isolation structures 4. $Al_2O_3$ is deposited with an about 20 nm film thickness at a processing temperature of about 300° C., by, for example, the ALD method. Instead of $Al_2O_3$, hafnium oxide ($HfO_2$), aluminum oxynitride (AlON), or tantalum oxide ($Ta_2O_5$) or any combination thereof may be deposited by, for example, the ALD method.

Consequently, the $Al_2O_3$ film 5A covering the whole surface of the compound semiconductor stack structure 2 including the areas on the element isolation structures 4 is formed.

Figure 9:
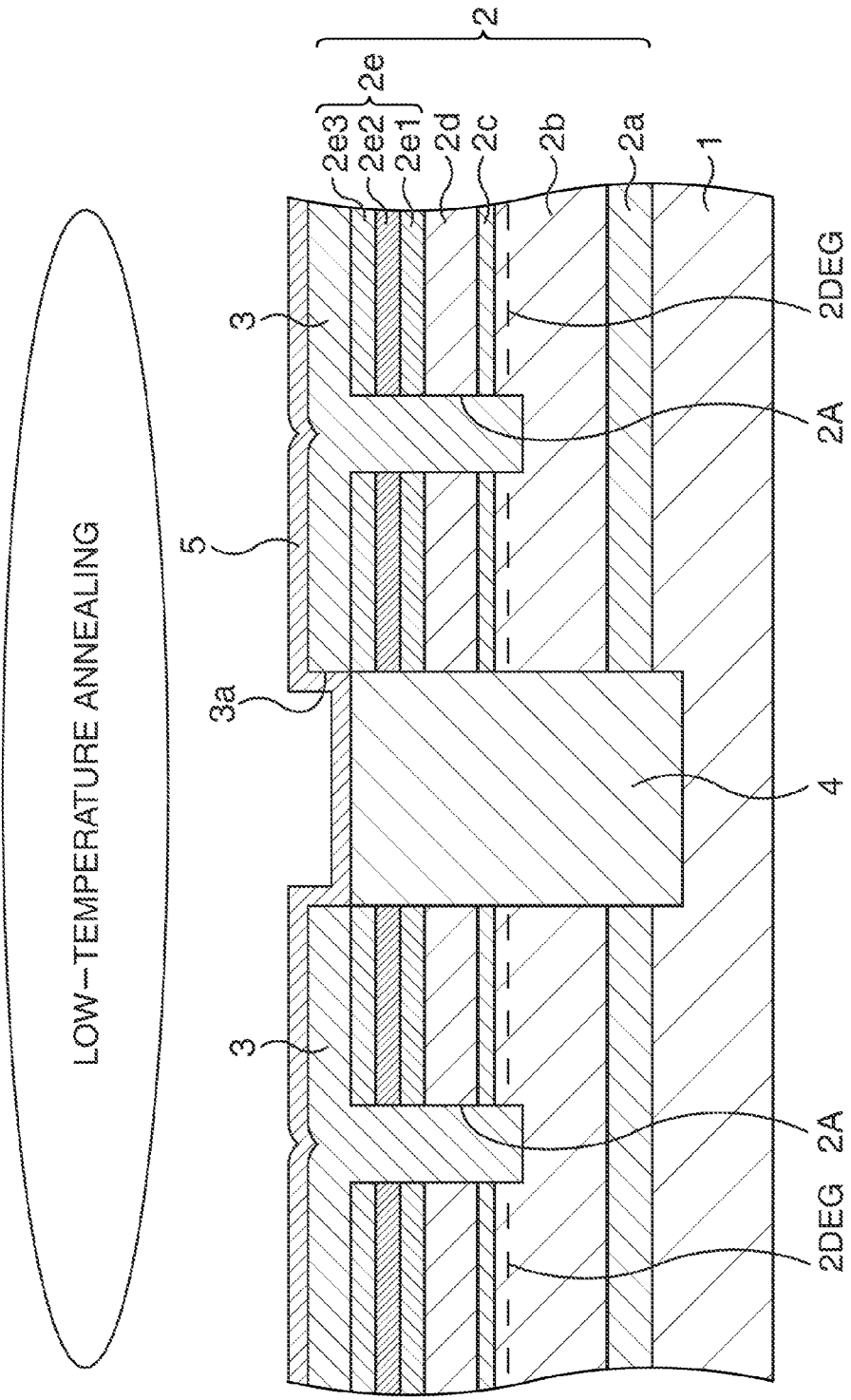
FIG. 9, which is continued from FIG. 8, is a schematic cross-sectional view illustrating the method of manufacturing the MIS-type AlGaN/GaN HEMT according to the first embodiment in order of steps.

Subsequently, as illustrated in FIG. 9, the low-temperature annealing is applied to the $Al_2O_3$ film 5A to form the second insulating film 5.

In more detail, the $Al_2O_3$ film 5A is subjected to the one-minute low-temperature annealing at a processing temperature of 700° C. or lower, here 600° C. which is lower than that of the aforesaid high-temperature annealing. By this low-temperature annealing, the $Al_2O_3$ film 5A becomes $Al_2O_3$ higher in hydrogen content than the aforesaid first insulating film 3. The $Al_2O_3$ film 5A having undergone the low-temperature annealing is the second insulating film 5. The hydrogen content of the second insulating film 5 becomes 1% or more, here about 10%, which is higher than that of the first insulating film 3. The hydrogen concentration of the second insulating film 5, as evaluated by the thermal desorption spectrometry method (TDS method), is $5 \times 10^{19}/cm^3$ or more, here about $5 \times 10^{19}/cm^3$.

Figure 10:
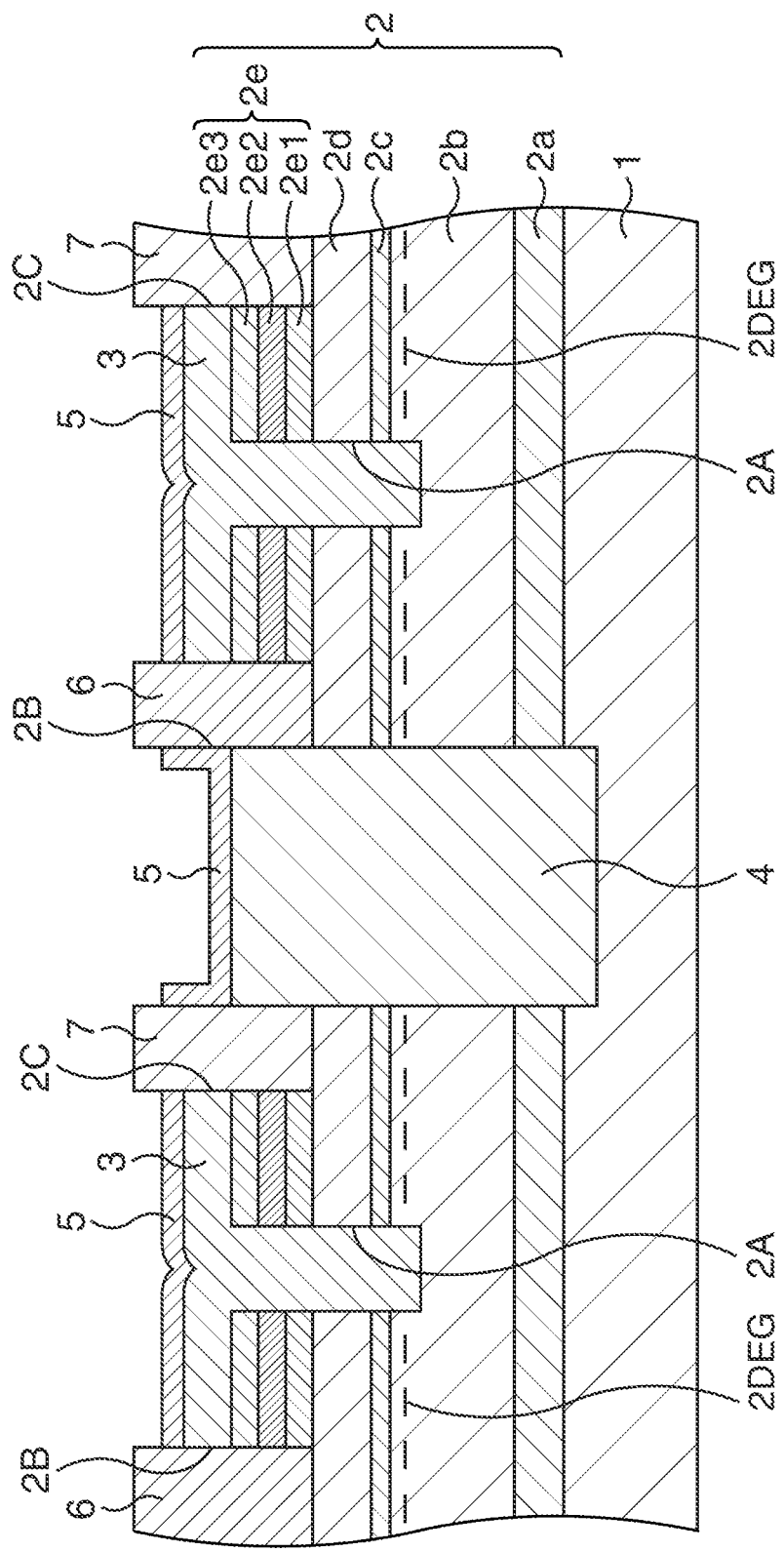
FIG. 10, which is continued from FIG. 9, is a schematic cross-sectional view illustrating the method of manufacturing the MIS-type AlGaN/GaN HEMT according to the first embodiment in order of steps.

Subsequently, as illustrated in FIG. 10, source electrodes 6 and drain electrodes 7 are formed.

In more detail, a resist is first applied on the surface of the compound semiconductor stack structure 2. The resist is processed by lithography, whereby openings from which portions corresponding to portions where to form the source electrodes and the drain electrodes, of the surface of the compound semiconductor layer structure 2 are exposed are formed. Consequently, a resist mask having the openings is formed.

By using this resist mask, the cap layer 2e is dry-etched until a surface of the electron supply layer 2d is exposed. Consequently, recesses 2B, 2C for electrodes from which the portions where to form the source electrodes and the drain electrodes on the surface of the electron supply layer 2d are exposed are formed in the cap layer 2e. For the dry etching, inert gas such as Ar and chlorine-based gas such as $Cl_2$ are used as etching gas. Incidentally, to form the recesses 2B, 2C for electrodes, the etching may be performed up to a middle of the cap layer 2e or the etching may be performed up to a predetermined depth from the electron supply layer 2d.

The resist mask is removed by wet processing, asking, or the like.

Next, a resist mask for forming the source electrodes and the drain electrodes is formed. Here, an eaves-structure double-layer resist suitable for a vapor deposition method and a liftoff method is used, for instance. This resist is applied on the compound semiconductor stack structure 2, and openings from which the recesses 2B, 2C for electrodes are exposed are formed. Consequently, the resist mask having the openings is formed.

By using this resist mask, Ta/Al, for example, are deposited as electrode materials on the resist mask including the inside of the recesses 2B, 2C for electrodes by, for example, the vapor deposition method. A thickness of Ta is about 30 nm and a thickness of Al is about 200 nm. The resist mask and Ta/Al deposited thereon are removed by the liftoff method. Thereafter, the Si substrate 1 is heat-treated, for example, in a nitride atmosphere at a temperature of about 400° C. to about 1000° C., for example, about 600° C., and the residual Ta/Al are brought into ohmic contact with the electron supply layer 2d. If the ohmic contact of Ta/Al and the electron supply layer 2d is obtained, the heat treatment is not sometimes necessary. Through the above processes, the source electrodes 6 and the drain electrodes 7 formed of parts of the electrode materials filling the recesses 2B, 2C for electrodes of the cap layer 2e are formed.

Figure 11:
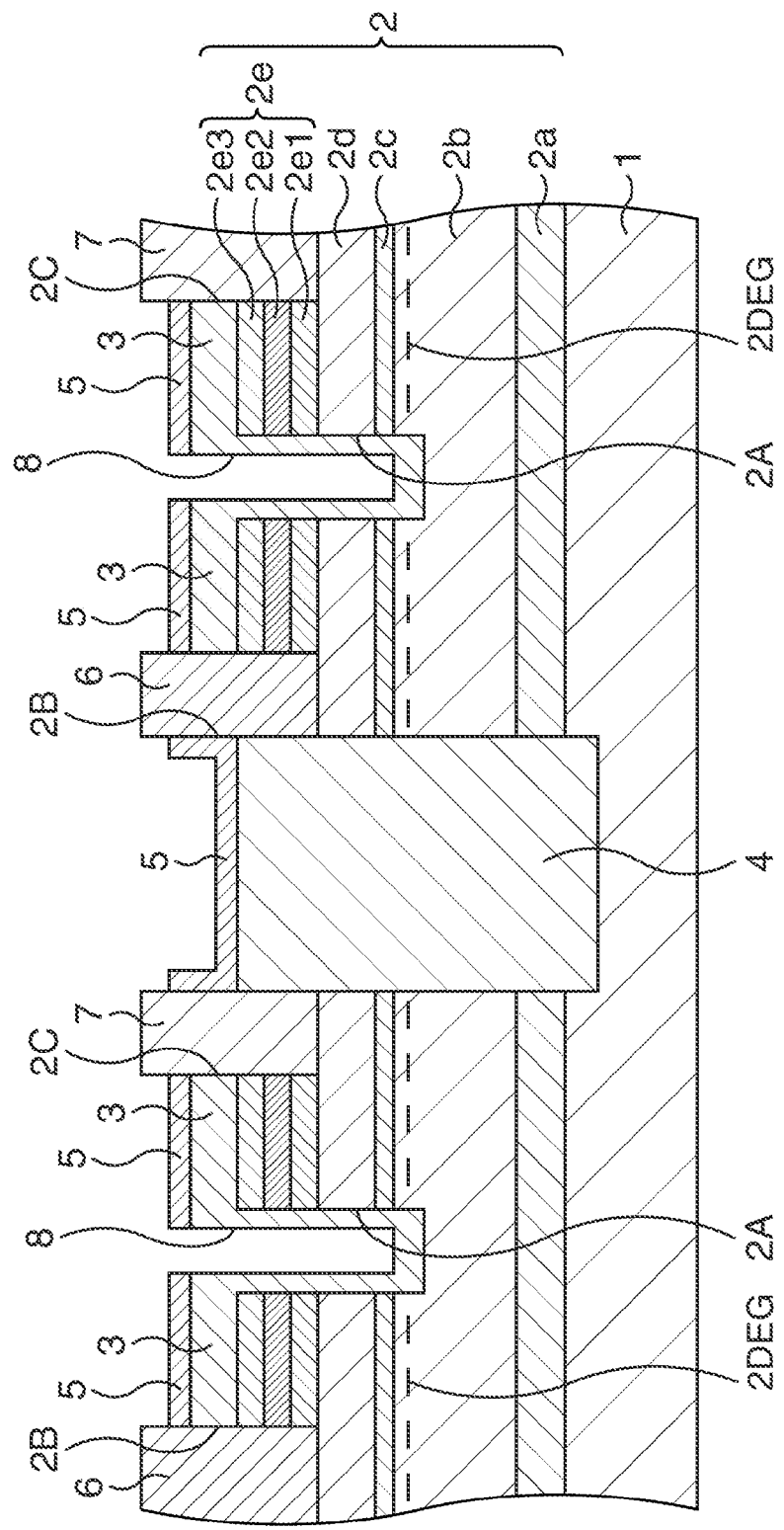
FIG. 11, which is continued from FIG. 10, is a schematic cross-sectional view illustrating the method of manufacturing the MIS-type AlGaN/GaN HEMT according to the first embodiment in order of steps.

Subsequently, as illustrated in FIG. 11, recesses 8 for electrodes are formed in portions where to form gate electrodes.

In more detail, a resist is first applied on the whole surface including areas on the second insulating film 5. The resist is processed by lithography, whereby openings from which portions corresponding to the portions where to form the gate electrodes, of the surface of the second insulating film 5 are exposed are formed in the resist. Consequently, a resist mask having the opening is formed.

By using this resist mask, the second insulating film 5 and the first insulating film 3 in the recesses 2A are dry-etched so that the first insulating film 3 remains on bottom portions with a predetermined thickness. Consequently, in the first insulating film 3 and the second insulating film 5 in the recesses 2A, the recesses 8 for electrodes on whose bottom portions the first insulating film 3 remains with the predetermined thickness are formed. The first insulating film 3 on the bottom portions function as a gate insulating film. For the dry etching, $SF_6$ is used as etching gas.

The resist mask is removed by wet processing, ashing, or the like.

Figure 12:
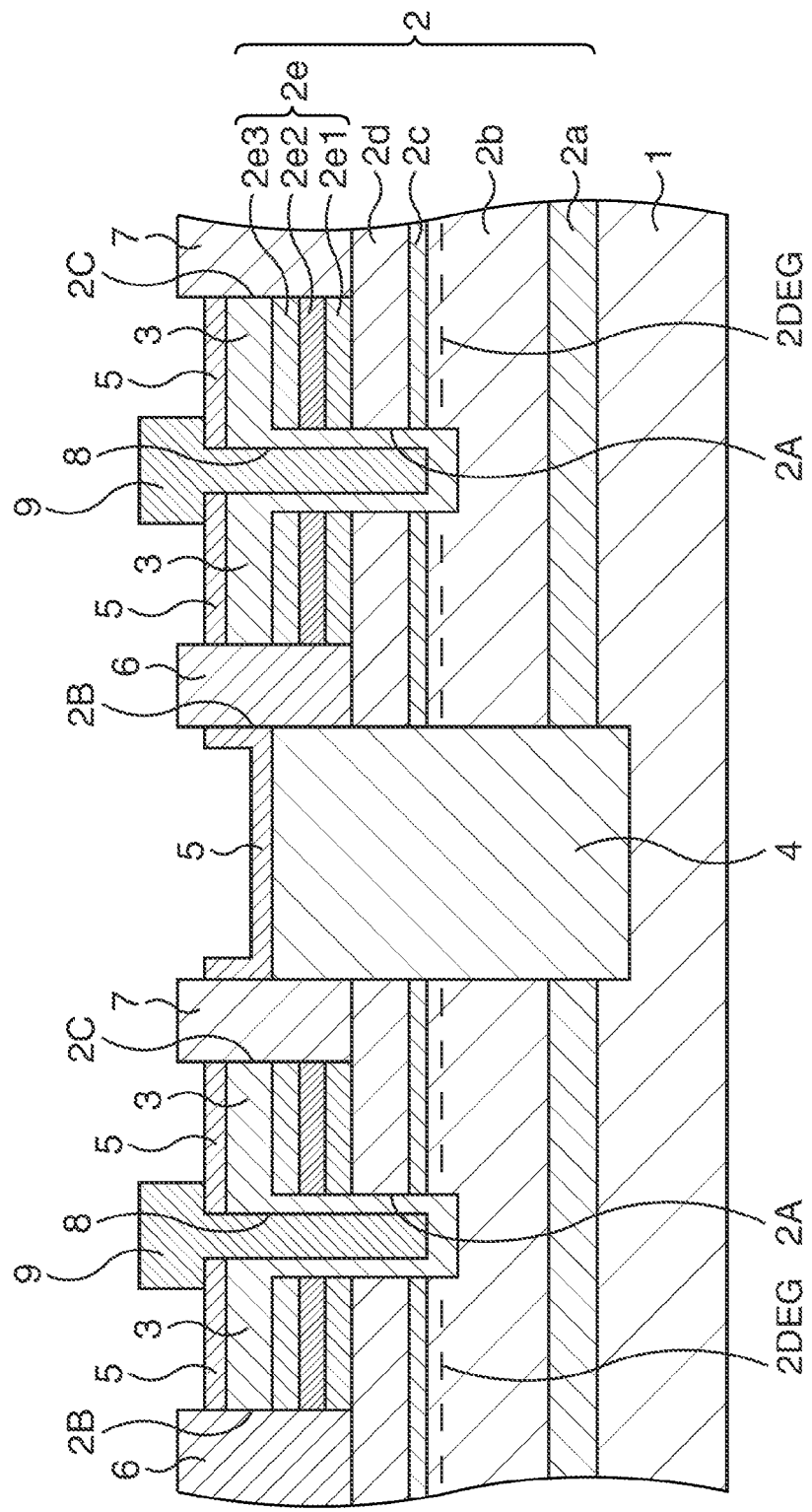
FIG. 12, which is continued from FIG. 11, is a schematic cross-sectional view illustrating the method of manufacturing the MIS-type AlGaN/GaN HEMT according to the first embodiment in order of steps.

Subsequently, the gate electrodes 9 are formed as illustrated in FIG. 12.

In more detail, a resist mask for forming the gate electrodes is first formed. Here, an eaves-structure double-layer resist suitable for the vapor deposition method and the liftoff method is used, for instance. This resist is applied on the whole surface, and openings from which the recesses 8 for electrodes are exposed are formed. Consequently, the resist mask having the opening is formed.

By using this resist mask, Ni/Au, for example, are deposited as electrode materials on the resist mask including the inside of the openings from which the recesses 8 for electrodes are exposed, by, for example, the vapor deposition method. A thickness of Ni is about 30 nm and a thickness of Au is about 400 nm. The resist mask and Ni/Au deposited thereon are removed by the liftoff method. Through the above processes, the gate electrodes 9 filling the inside of the recesses 8 for electrodes and projecting above the second insulating film 5 are formed. The first insulating film 3 under the gate electrodes 9 becomes a gate insulating film.

Thereafter, through steps such as the formation of wirings connected to the source electrodes 6, the drain electrodes 7, and the gate electrodes 9, the MIS-type AlGaN/GaN HEMT according to this embodiment is formed.

Here, operations and effects that the AlGaN/GaN HEMT according to this embodiment has will be described based on the comparison with a comparative example.

Figure 13:
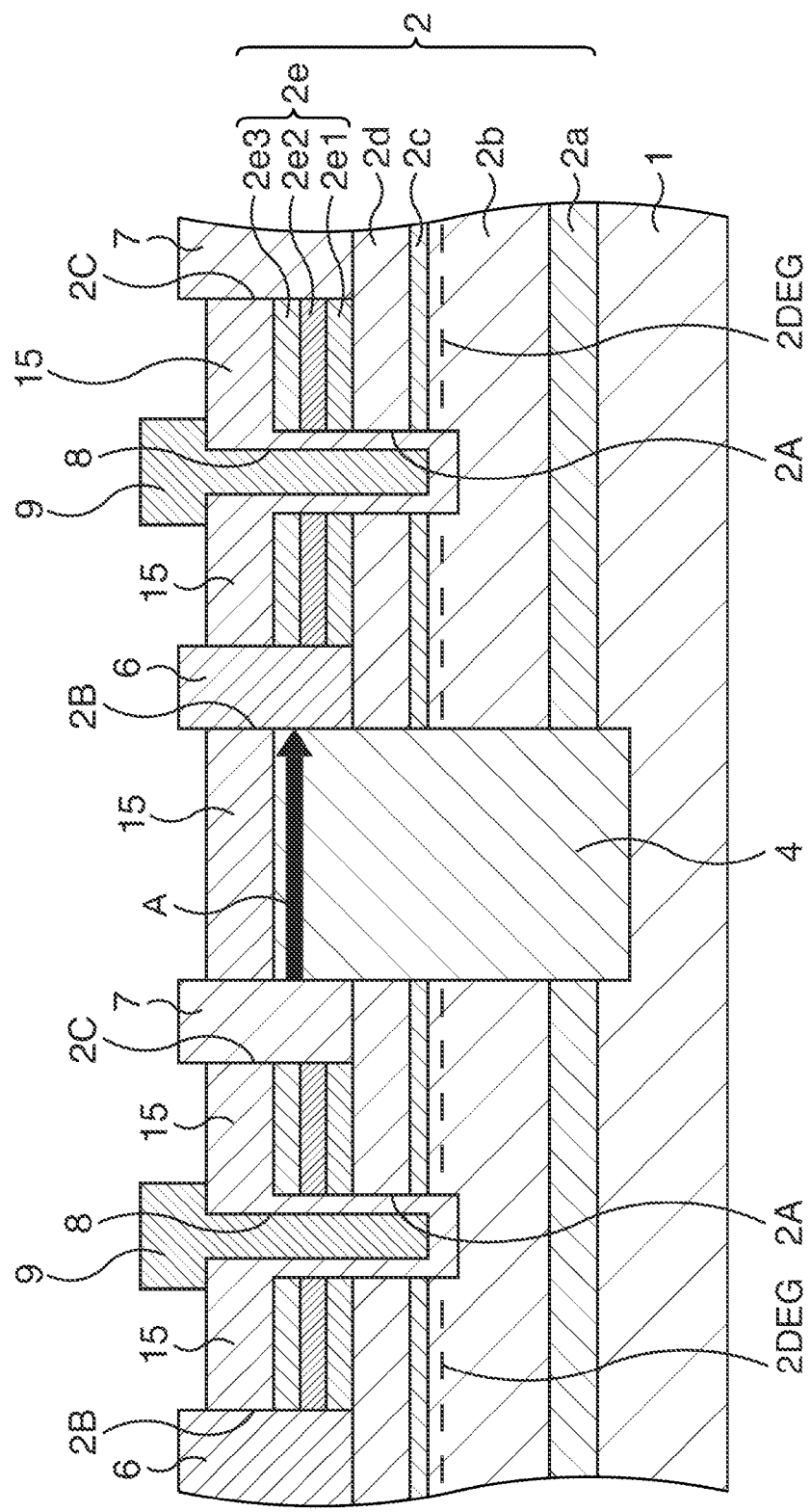
FIG. 13 is a schematic cross-sectional view illustrating an AlGaN/GaN HEMT of a comparative example.

FIG. 13 is a schematic cross-sectional view illustrating an AlGaN/GaN HEMT of the comparative example. In FIG. 13, the same constituent members and so on as those of the AlGaN/GaN HEMT according to this embodiment are denoted by the same reference signs.

In the AlGaN/GaN HEMT of the comparative example, a protection film 15 is formed instead of forming the first insulating film 3 and the second insulating film 5 in this embodiment. The other structures are the same as those of this embodiment, and therefore in FIG. 13, they are denoted by the same reference signs as those in FIG. 12. The protection film 15 is formed on the whole surface of a compound semiconductor stack structure 2 (including areas on element isolation structures 4) in order to protect an element surface.

In the comparative example where the protection film 15 is formed, in the element isolation structure 4, an off-leakage current flows in the element isolation structure 4 between adjacent drain electrode 7 and source electrode 8 in the AlGaN/GaN HEMT as illustrated by the arrow A in FIG. 13.

Figure 14:
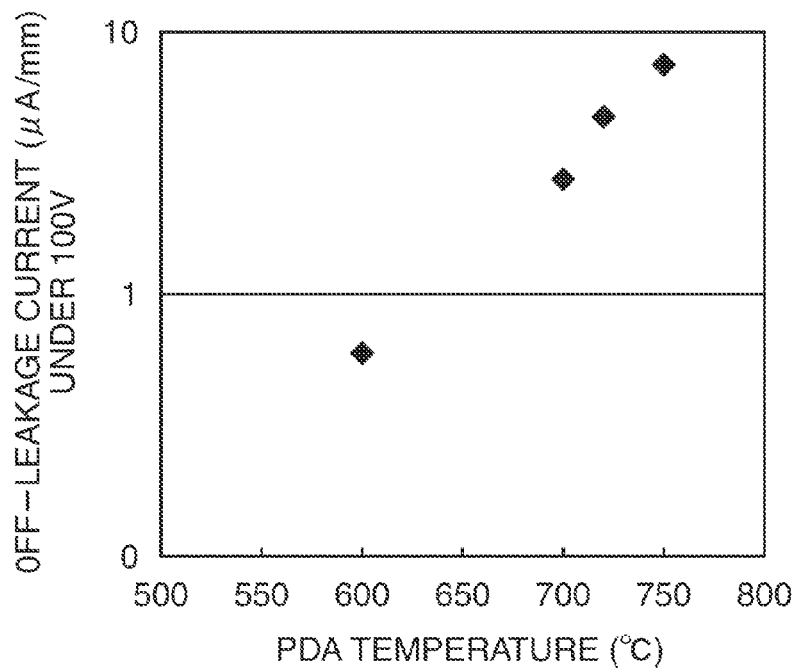
FIG. 14 is a characteristic chart illustrating a result of a study on a correlation of off-leakage current with PDA temperature in the comparative example.

In this embodiment, attention is focused on a correlation of the off-leakage current with the protection film 15. FIG. 14 is a characteristic chart illustrating a result of a study on a correlation of the off-leakage current with PDA temperature in the comparative example. The PDA (Post Deposition Anneal) temperature represents temperature of annealing after the protection film is formed. In FIG. 14, four kinds of samples were fabricated for the AlGaN/GaN HEMT of the comparative example having the protection film 15. These samples are formed in such a manner that, after $Al_2O_3$ films are formed by the ALD method, they are annealed for one minute at processing temperatures of 600° C., 700° C., 720° C., and 750° C. respectively. The samples will be called samples 1 to 4 respectively.

As is seen in FIG. 14, in the sample 1, the off-leakage current presented an insignificantly low value. On the other hand, in the samples 2, 3, 4, the off-leakage current presented large values. It has become clear that the off-leakage current thus has an obvious correlation with the PDA temperature.

Keeping the result in FIG. 14 in mind, a correlation of an amount of 2DEG generated in the AlGaN/GaN HEMT of the comparative example with the PDA temperature was studied. The amount of the 2DEG generated is larger as a sheet resistance value is lower.

Figure 15:
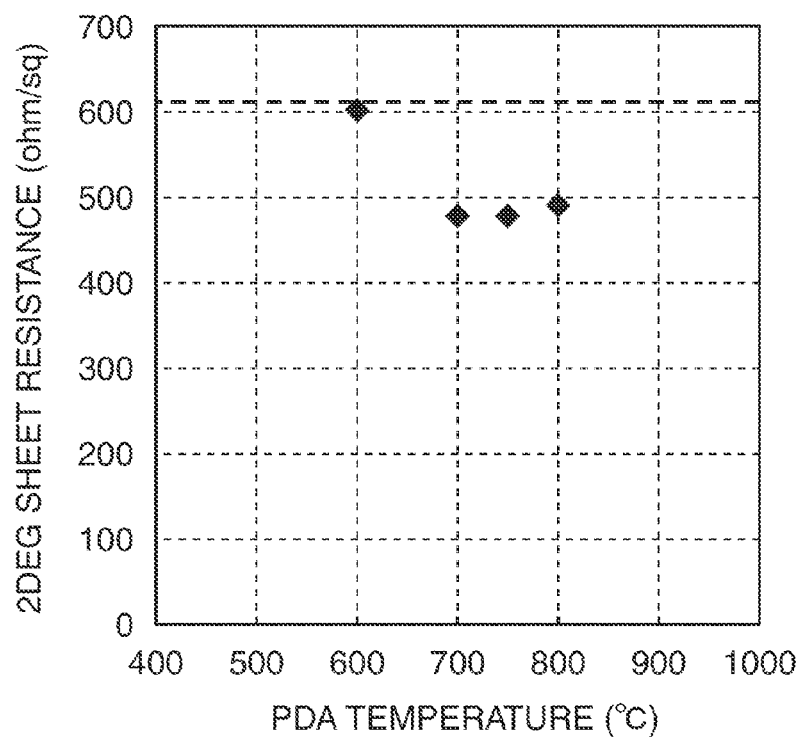
FIG. 15 is a characteristic chart illustrating a result of a study on a correlation of a 2DEG sheet resistance value with the PDA temperature.

FIG. 15 is a characteristic chart illustrating a result of a study on a correlation of the 2DEG sheet resistance value with the PDA temperature. The broken line in FIG. 15 represents the 2DEG sheet resistance value at a stage when the compound semiconductor stack structure 2 is epitaxially grown. In FIG. 15, four kinds of samples were fabricated for the AlGaN/GaN HEMT of the comparative example having the protection film 15. These samples are formed in such a manner that, after $Al_2O_3$ films are formed by the ALD method, they are annealed for one minute at processing temperatures of 600° C., 700° C., 750° C., 800° C. respectively. The samples will be called samples 1 to 4 respectively.

As is seen in FIG. 15, in the sample 1, the 2DEG sheet resistance value presents a value close to that at the time of the growth of the compound semiconductor stack structure 2, which indicates that the 2DEG amount is close to a desired value. On the other hand, in the samples 2, 3, 4, the 2DEG sheet resistance value is low, which indicates that the 2DEG amount is larger than the desired value. A possible reason why the 2DEG amount thus increases when the protection film is annealed at the processing temperature of 700° C. or higher is that the high-temperature annealing decreases an energy band on surfaces of the element isolation structures.

Figure 16:
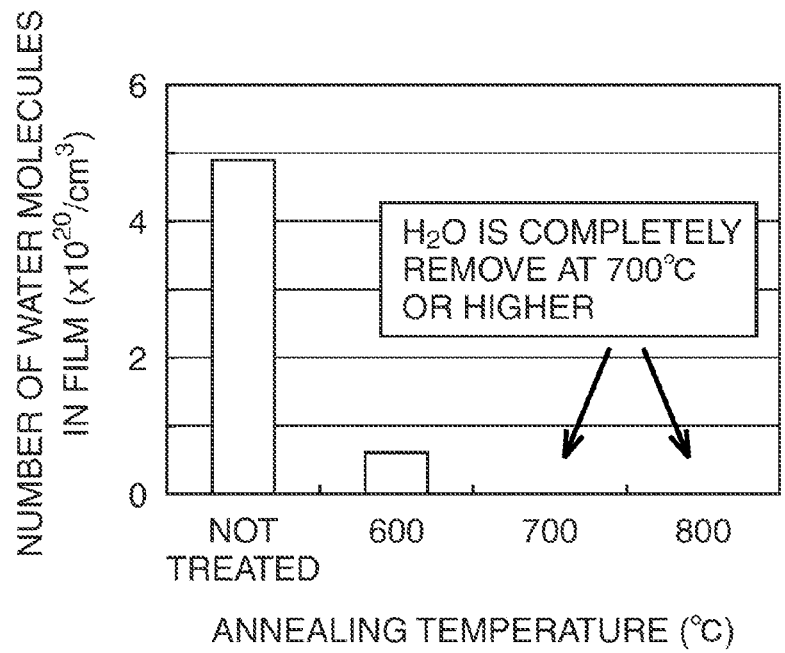
FIG. 16 is a characteristic chart illustrating a result of a study on a correlation of moisture concentration in a protection film with annealing temperature.

Based on the result in FIG. 15, it was inferred that the decrease of the energy band on the surfaces of the element isolation structures was ascribable to a change in the hydrogen content (moisture content) in the protection film caused by the annealing, and a correlation of the moisture concentration in the protection film with the annealing temperature was studied. A result thereof is illustrated in FIG. 16. As illustrated in FIG. 16, as compared with the moisture content of the protection film not having undergone the annealing, the moisture content reduces as the annealing temperature increases, and when the annealing temperature is set to 700° C. and 800° C., the moisture in the protection film is almost completely removed.

In this embodiment, on the element regions, the first insulation film 3 having high insulating film quality, that is, having undergone the high-temperature annealing is formed as the protection film as described above. On the other hand, on the element isolation structures 4, the first insulating film 3 is not formed, and instead, the second insulating film 5 higher in hydrogen content than the first insulating film 2, that is, having undergone the low-temperature annealing is formed.

Figure 17:
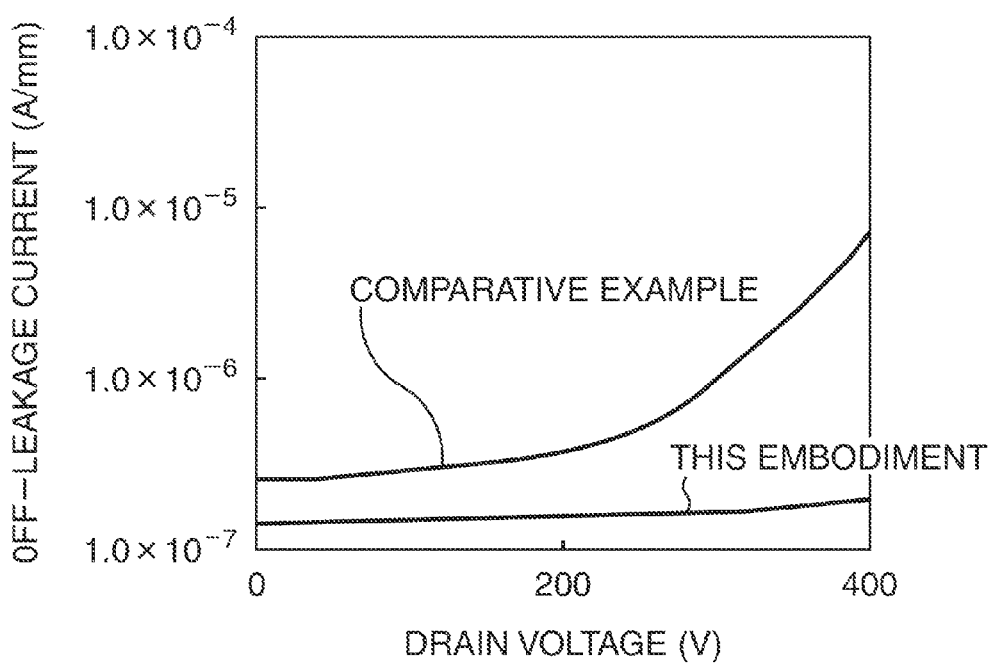
FIG. 17 is a characteristic chart illustrating a result obtained when a correlation of the off-leakage current with drain voltage in the AlGaN/GaN HEMT according to the embodiment is studied based on the comparison with the comparative example.

In the AlGaN/GaN HEMT according to this embodiment, a correlation of the off-leakage current with drain voltage was studied based on the comparison with a comparative example. The measurement result is illustrated in FIG. 17. In FIG. 17, the comparative example is the AlGaN/GaN HEMT in which the protection film 15 is formed by the 700° C., high-temperature annealing in FIG. 13. As is seen in FIG. 17, in the comparative example, the off-leakage current presented high values over the whole measurement range from 0 V to 400 V of the drain voltage, and it increased as the drain voltage increased. On the other hand, in this embodiment, the off-leakage current presented almost no change and presented low values over the whole measurement range from 0 V to 400 V of the drain voltage. It has been found out that, in this embodiment, since the first insulating film 3 being the protection film of the element regions does not contain hydrogen, a stable transistor operation is exhibited, but surface leakage paths are not formed on the element isolation structures 4, and the off-leakage current is greatly improved. In the AlGaN/GaN HEMT according to this embodiment, owing to the improvement in the off-leakage current, transistor reliability also improves, and an average life of $1 \times 10^6$ hours was confirmed under 200° C., high-temperature electricity supply when the drain voltage was 400 V.

As described above, this embodiment realizes a highly reliable MIS-type AlGaN/GaN HEMT in which the protection film (first insulating film 3) functioning also as the gate insulating film is formed to have excellent insulating film quality but the occurrence of the off-leakage current is surely inhibited, enabling a reduction in a loss at the power-off time.

In the foregoing, the example where $Al_2O_3$ is deposited as the first and second insulating films is presented. When $HfO_2$ is formed instead of $Al_2O_3$ as the first and second insulating films, they are formed in the following manner, for instance. A $HfO_2$ film is formed by the atomic layer deposition (ALD) method or the like, this $HfO_2$ film is subjected to 700° C. high-temperature annealing for one minute, whereby the first insulating film is formed. Similarly, a $HfO_2$ film is formed by the ALD method or the like, and this $HfO_2$ film is subjected to 500° C. low-temperature annealing for one minute, whereby the second insulating film is formed.

When AlON is formed instead of $Al_2O_3$ as the first and second insulating films, they are formed in the following manner, for instance. An AlON film is formed by the ALD method or the like, and this AlON film is subjected to 750° C. high-temperature annealing for one minute, whereby the first insulating film is formed. Similarly, an AlON film is formed by the ALD method or the like and this AlON film is subjected to 600° C. low-temperature annealing for one minute, whereby the second insulating film is formed. Similarly to the AlGaN/GaN HEMT having the first and second insulating films made of $Al_2O_3$, an AlGaN/GaN HEMT having the first and second insulating films made of AlON presented a low off-leakage current, but could realize a high on-current (about 1.5 times as that of the comparative example in FIG. 13). This is because the first and second insulating films made of AlON are formed as films having little trap and deep levels trapping electrons are decreased. Thus, a secondary effect of suppressing an increase in on-resistance has also been confirmed.

When $Ta_2O_5$ is formed instead of $Al_2O_3$ as the first and second insulating films, they are formed in the following manner, for instance. A $Ta_2O_5$ film is formed by a sputtering method or the like and this $Ta_2O_5$ film is subjected to 600° C. high-temperature annealing for one minute, whereby the first insulating film is formed. Similarly, a $Ta_2O_5$ film is formed by the sputtering method or the like and this $Ta_2O_5$ film is subjected to 300° C. low-temperature annealing for one minute, whereby the second insulating film is formed.

Modification Example

Here, a modification example of this embodiment will be described. In this embodiment, the second insulating film 5 on the element regions is left, taking a reduction in steps of the manufacturing process into consideration, but the second insulating film 5 on the element regions may be removed.

Figure 18:
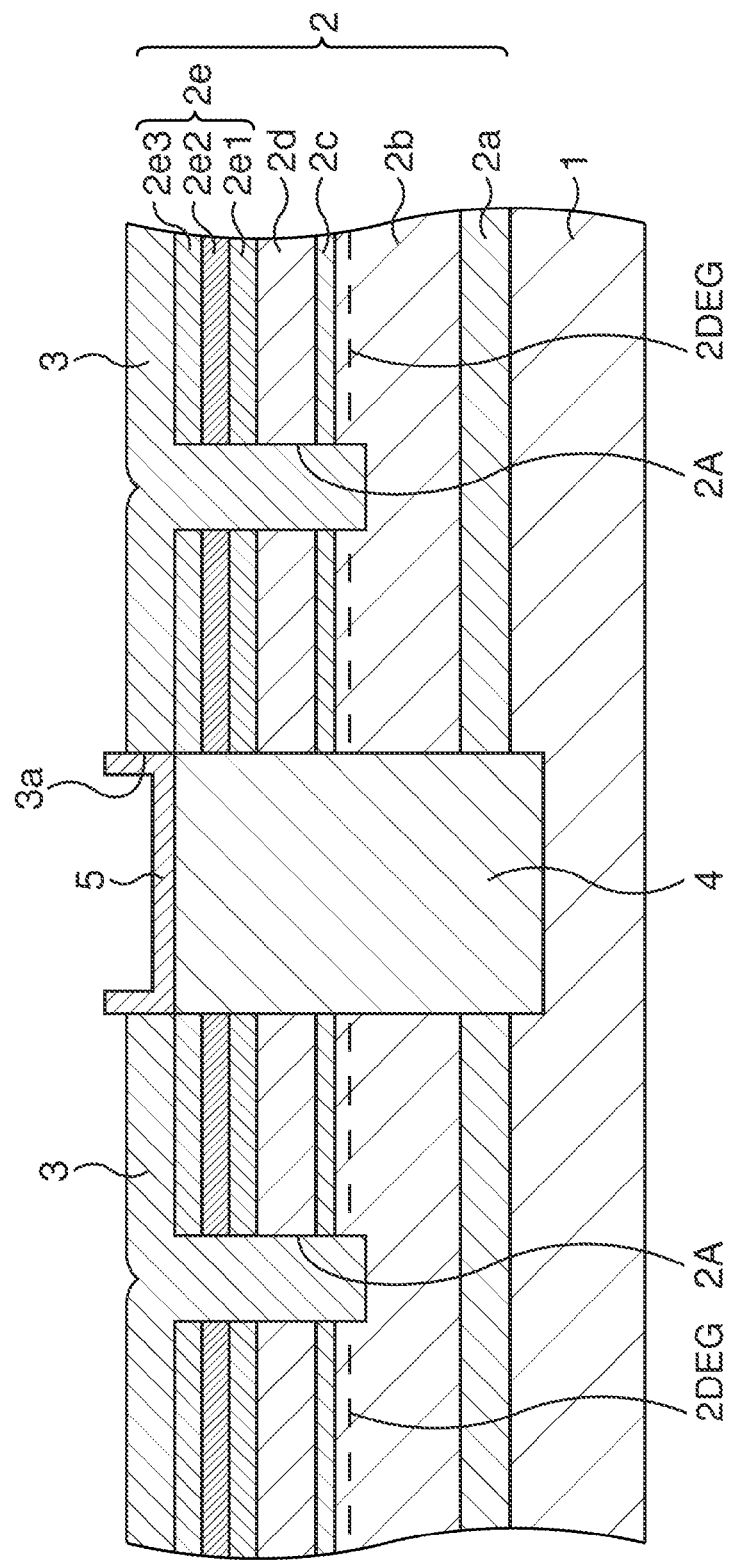
FIG. 18 is a schematic cross-sectional view illustrating a main step of a method of manufacturing a MIS-type AlGaN/GaN HEMT according to a modification example of the first embodiment.
Figure 19:
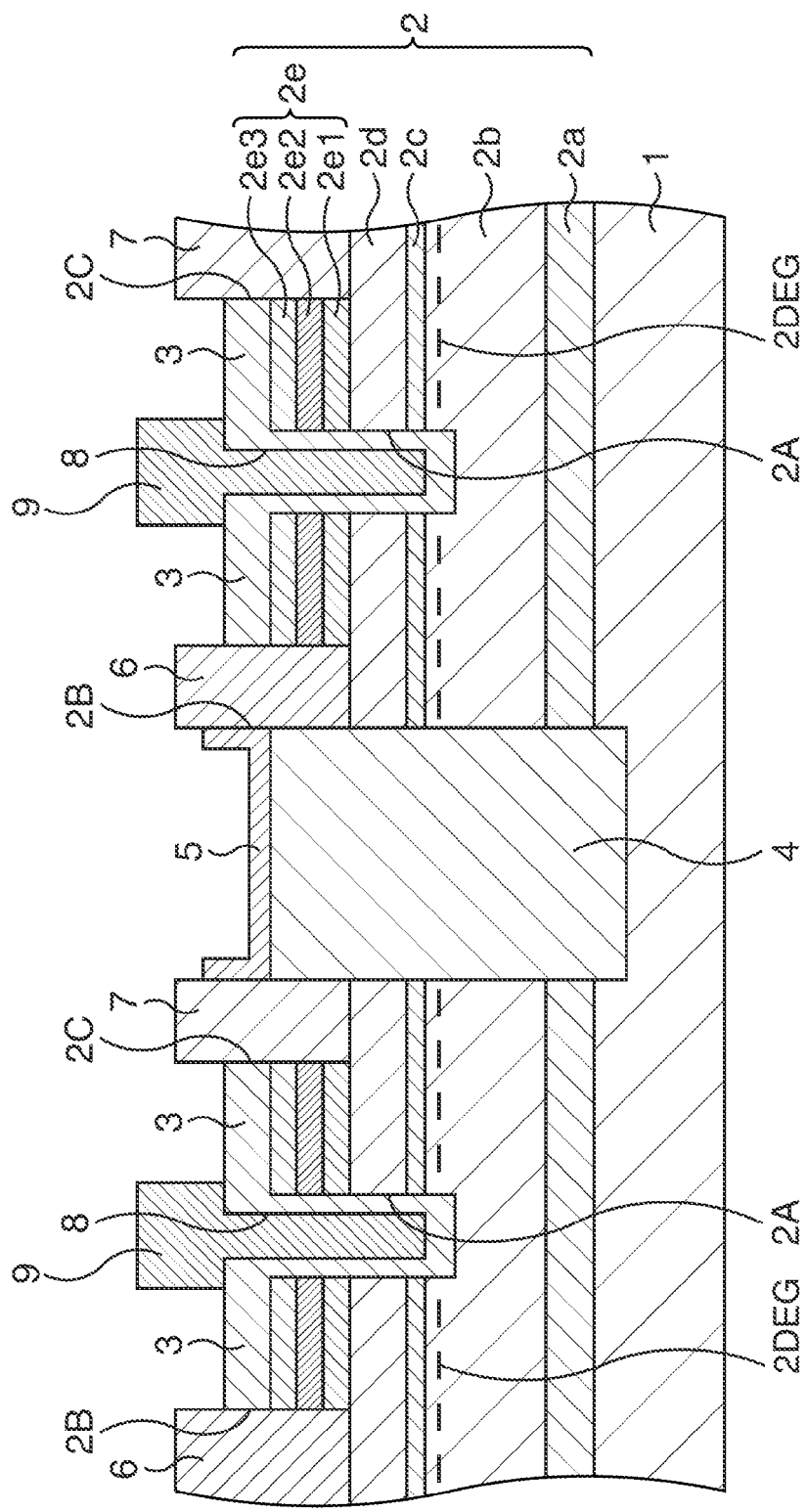
FIG. 19, which is continued from FIG. 18, is a schematic cross-sectional view illustrating a main step of the method of manufacturing the MIS-type AlGaN/GaN HEMT according to the modification example of the first embodiment.

FIG. 18 and FIG. 19 are schematic cross-sectional views illustrating main steps of a manufacturing method of a MIS-type AlGaN/GaN HEMT according to the modification example of the first embodiment. The same constituent members and so on as those of the first embodiment will be denoted by the same reference signs and a detailed description thereof will be omitted.

In this modification example, the steps in FIG. 2 to FIG. 9 are first performed as in the first embodiment.

Subsequently, as illustrated in FIG. 18, a second insulating film 5 on element regions is removed.

In more detail, a resist mask covering only portions on element isolation structures 4, of the second insulating film 5 is formed by lithography. By using this resist mask, the second insulating film 5 is wet-etched using a predetermined etching solution. Consequently, the second insulating film 5 on the element regions is removed and the second insulating film 5 is left only on the element isolation structures 4.

The resist mask is removed by wet processing, ashing, or the like.

Thereafter, as illustrated in FIG. 19, the steps in FIG. 10 to FIG. 12 are performed to form source electrodes 6, drain electrodes 7, and gate electrodes 9, as in the first embodiment.

Thereafter, through steps such as the formation of wirings connected to the source electrodes 6, the drain electrodes 7, and the gate electrodes 9, the MIS-type AlGaN/GaN HEMT according to this modification example is formed.

This modification example realizes a highly reliable MIS-type AlGaN/GaN HEMT in which a protection film (first insulating film 3) functioning also as a gate insulating film is formed to have excellent insulating film quality but the occurrence of an off-leakage current is surely inhibited, enabling a reduction in a loss at the power-off time.

Second Embodiment

In this embodiment, a Schottky-type AlGaN/GaN HEMT is disclosed as the compound semiconductor device.

Figure 20:
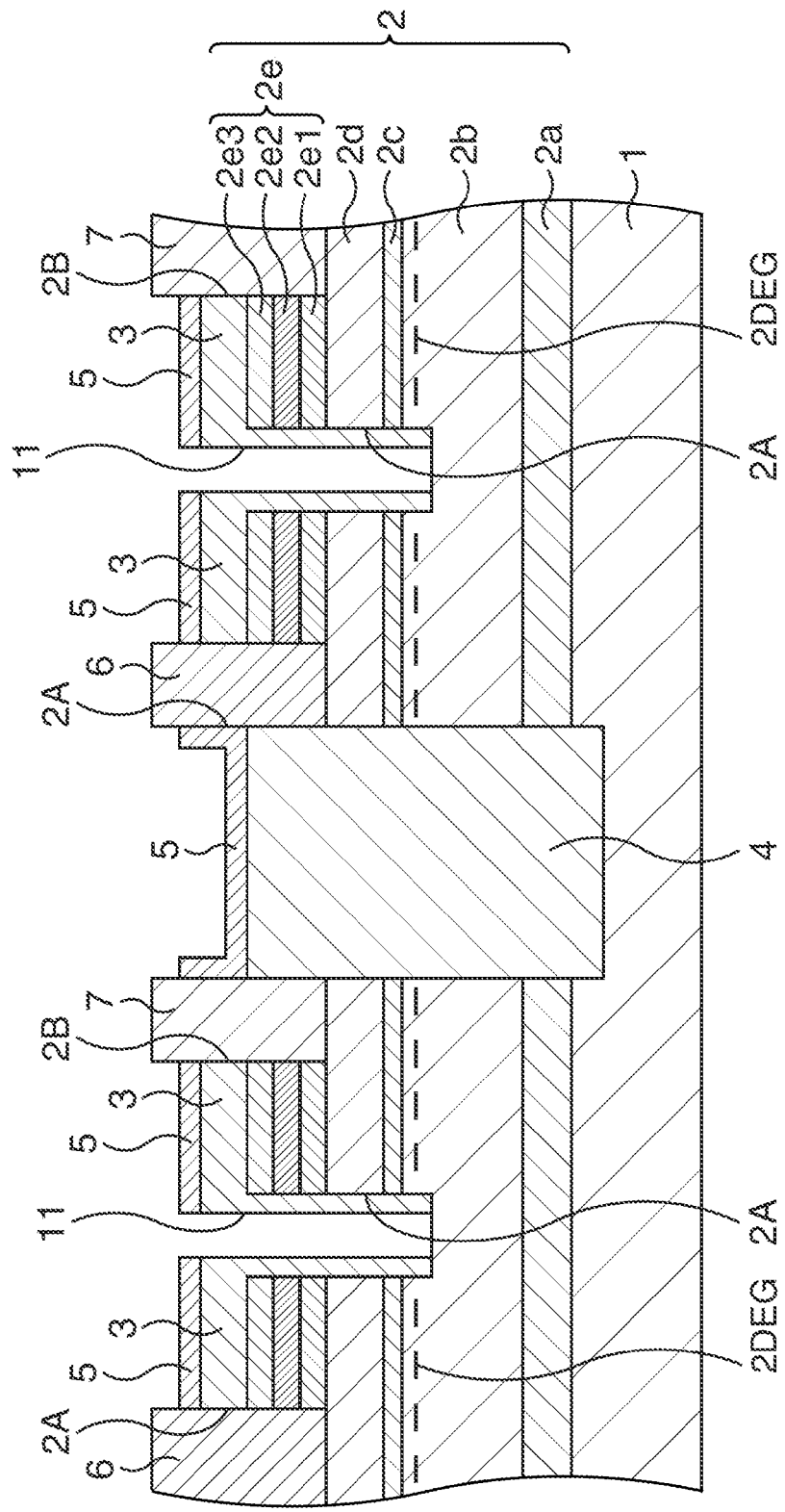
FIG. 20 is a schematic cross-sectional view illustrating a main step of a method of manufacturing a Schottky-type AlGaN/GaN HEMT according to a second embodiment.
Figure 21:
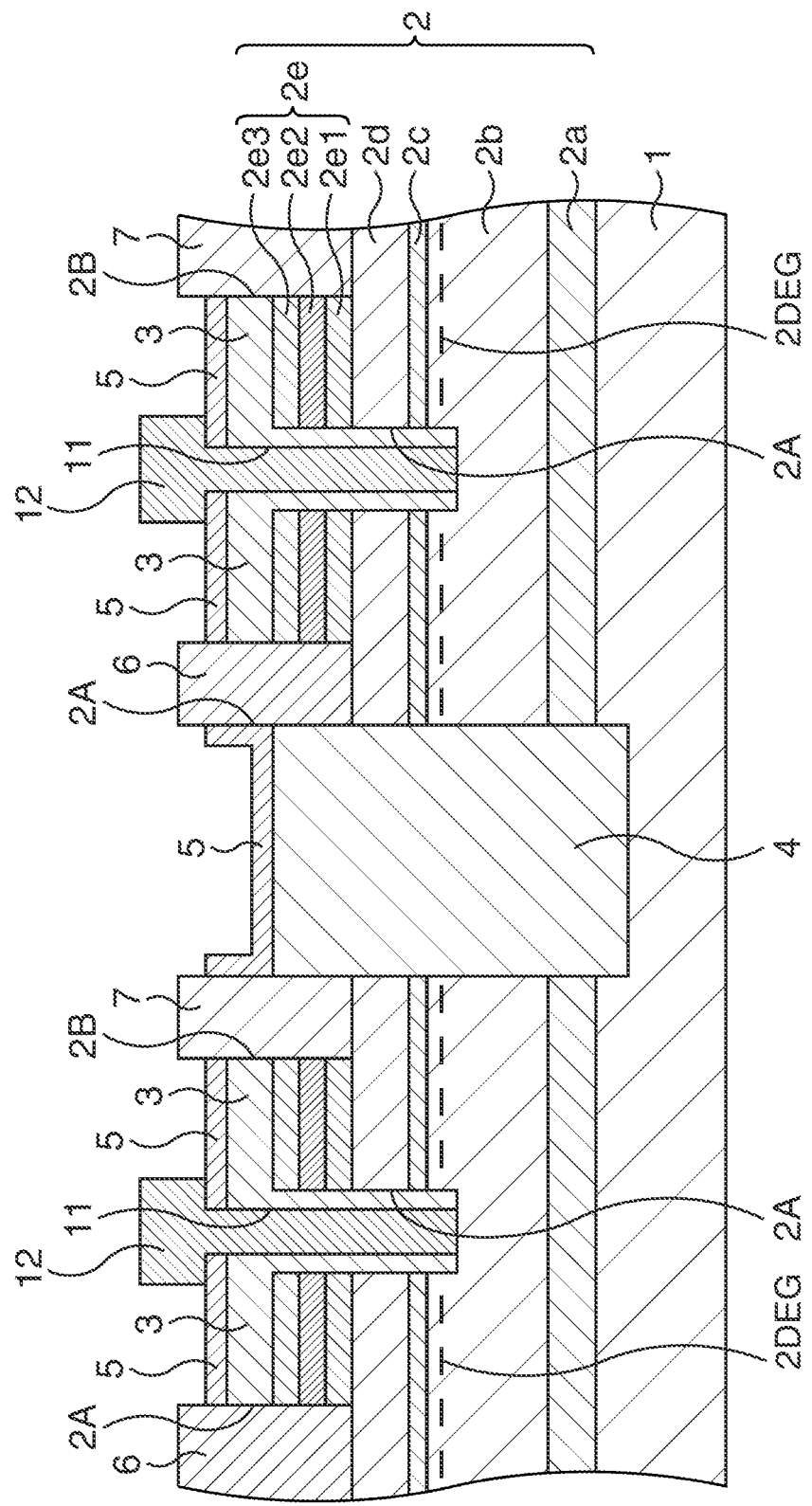
FIG. 21, which is continued from FIG. 20, is a schematic cross-sectional view illustrating a main step of the method of manufacturing the Schottky-type AlGaN/GaN HEMT according to the second embodiment.

FIG. 20 and FIG. 21 are schematic cross-sectional views illustrating main steps of a manufacturing method of the Schottky-type AlGaN/GaN HEMT according to the second embodiment. The same constituent members and so on as those of the first embodiment will be denoted by the same reference signs and a detailed description thereof will be omitted.

In this embodiment, the steps in FIG. 2 to FIG. 10 are first performed as in the first embodiment.

Subsequently, as illustrated in FIG. 20, recesses 11 for electrodes are formed at portions where to form gate electrodes.

In more detail, a resist is applied on the whole surface including areas on a second insulating film 5. The resist is processed by lithography, whereby openings from which portions corresponding to the portions where to form the gate electrodes, of a surface of the second insulating film 5 are exposed are formed in the resist. Consequently, a resist mask having the openings is formed.

By using this resist mask, the second insulating film 5 and a first insulating film 3 in recesses 2A are dry-etched until an electron transit layer 2b on bottom surfaces of the recesses 2A are exposed. Consequently, in the first insulating film 3 and the second insulating film 5 in the recesses 2A, the recesses 11 for electrodes from whose bottom portions the electron transit layer 2b is exposed are formed. For the dry etching, $Cl_2$ is used as etching gas.

The resist mask is removed by wet processing, ashing, or the like.

Subsequently, as illustrated in FIG. 21, gate electrodes 12 are formed.

In more detail, a resist mask for forming the gate electrodes is first formed. Here, an eaves-structure double-layer resist suitable for a vapor deposition method and a lift-off method is used, for instance. This resist is applied on the whole surface, and openings from which the recesses 11 for electrodes are exposed are formed. Consequently, the resist mask having the openings is formed.

By using this resist mask, for example, Ni/Au are deposited as electrode materials by, for example, the vapor deposition method on the resist mask including the inside of the openings from which the recesses 11 for electrodes are exposed. A thickness of Ni is about 30 nm and a thickness of Au is about 400 nm. The resist mask and Ni/Au deposited thereon are removed by the lift-off method. Consequently, the gate electrodes 12 filling the inside of the recesses 11 for electrodes and projecting above the second insulating film 5 are formed. The gate electrodes 12 are in Schottky contact with the electron transit layer 2b.

Thereafter, through steps such as the formation of wirings connected to source electrodes 6, drain electrodes 7, and the gate electrodes 12, the Schottky-type AlGaN/GaN HEMT according to this embodiment is formed.

As described above, this embodiment realizes a highly reliable Schottky-type AlGaN/GaN HEMT in which a first insulating film 3 being a protection film of a compound semiconductor stack structure 2 is formed to have excellent insulating film quality but the occurrence of an off-leakage current is surely inhibited, enabling a reduction in a loss at the power-off time.

Modification Example

Here, a modification example of this embodiment will be described. This embodiment adopts the structure in which the recesses 2A for electrodes are formed prior to the formation of the recesses 11 for electrodes, and the first insulating film 3 serving as the protection film of the compound semiconductor stack structures 2 is filled therein, but the recesses 2A for electrodes do not necessarily have to be formed.

Figure 22:
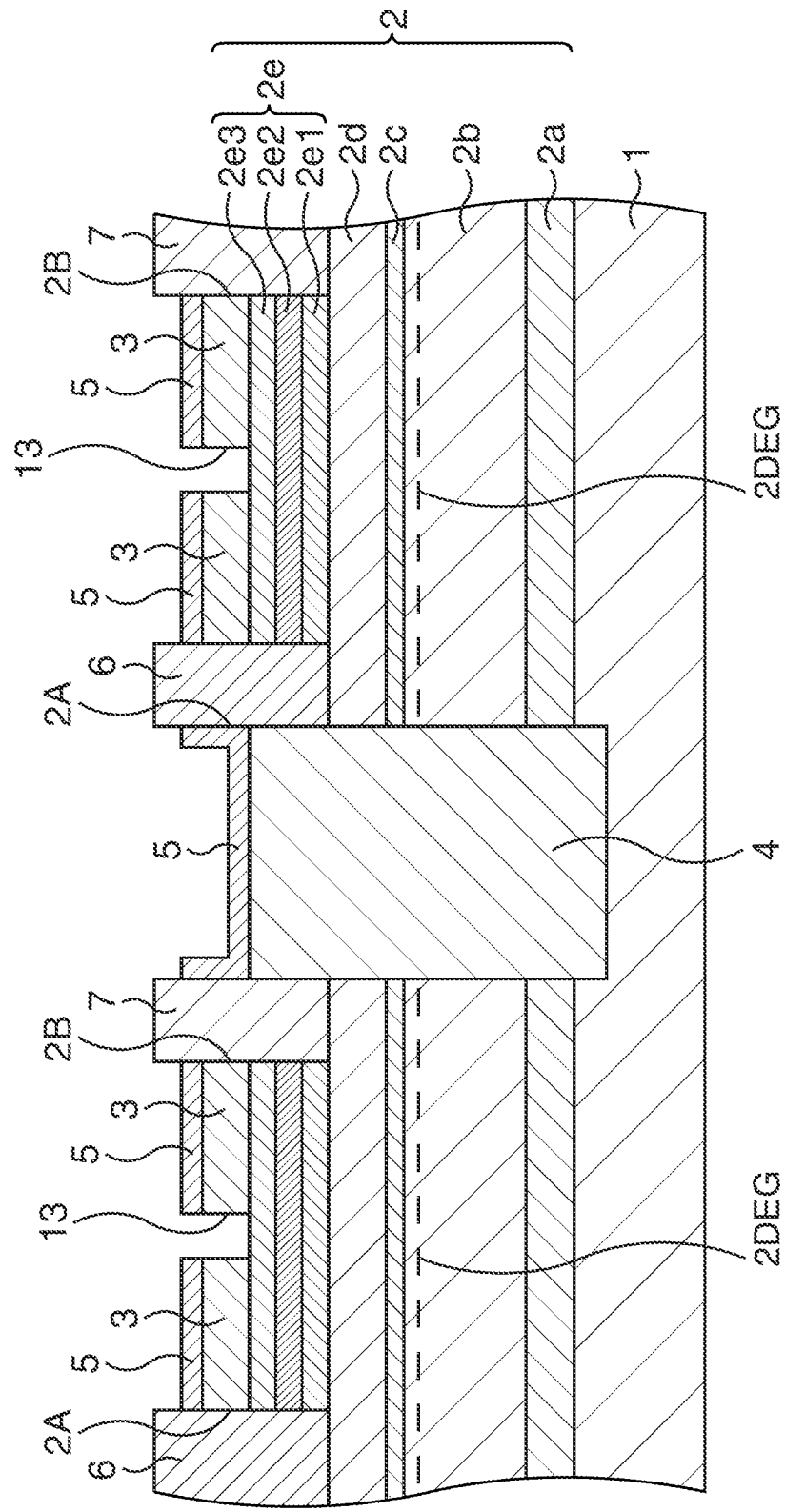
FIG. 22 is a schematic cross-sectional view illustrating a main step of a method of manufacturing a Schottky-type AlGaN/GaN HEMT according to a modification example of the second embodiment.
Figure 23:
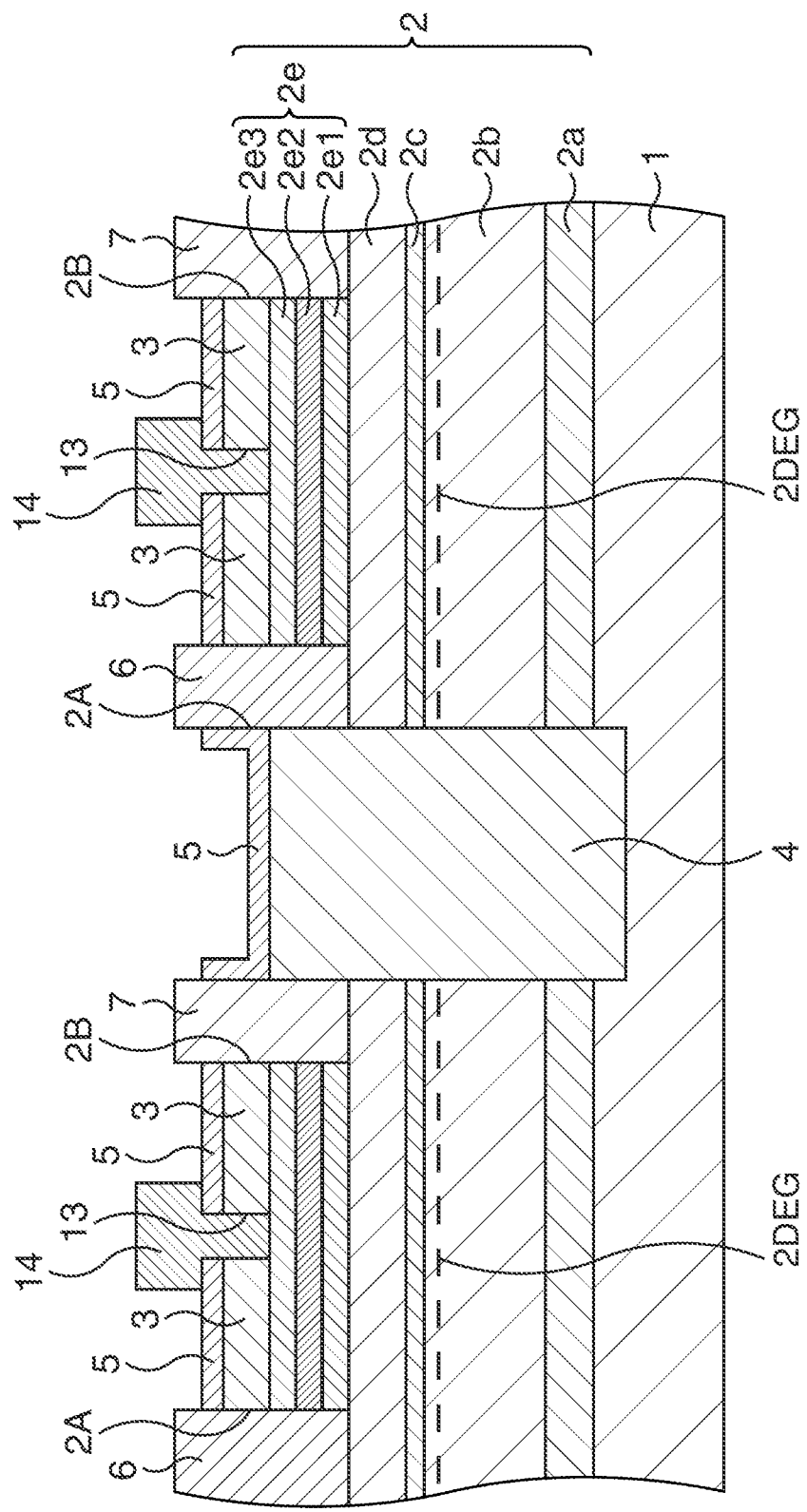
FIG. 23, which is continued from FIG. 22, is a schematic cross-sectional view illustrating a main step of the method of manufacturing the Schottky-type AlGaN/GaN HEMT according to the modification example of the second embodiment.

FIG. 22 and FIG. 23 are schematic cross-sectional views illustrating main steps of a manufacturing method of a Schottky-type AlGaN/GaN HEMT according to the modification example of the second embodiment. The same constituent members and so on as those of the first and second embodiments will be denoted by the same reference signs and a detailed description thereof will be omitted.

In this modification example, after the step in FIG. 2, the step in FIG. 3 is not performed as is performed in the first embodiment, and the steps in FIG. 4 to FIG. 10 are first performed.

Subsequently, as illustrated in FIG. 22, recesses 13 for electrodes are formed in portions where to form gate electrodes.

In more detail, a resist is first applied on the whole surface including areas on a second insulating film 5. The resist is processed by lithography, whereby openings from which portions corresponding to the portions where to form the gate electrodes, of a surface of a second insulating film 5 are exposed are formed in the resist. Consequently, a resist mask having the openings is formed.

By using this resist mask, the second insulating film 5 and a first insulating film 3 are dry-etched until a surface of a compound semiconductor stack structure 2 (surface of a cap layer 2e) is exposed. Consequently, recesses 13 for electrodes from whose bottom portions the surface of the cap layer 2e is exposed are formed in the first insulating film 3 and the second insulating film 5. For the dry etching, SF, is used as etching gas.

The resist mask is removed by wet processing, ashing, or the like.

Subsequently, gate electrodes 14 are formed as illustrated in FIG. 23.

In more detail, a resist mask for forming the gate electrodes is first formed. Here, an eaves-structure double-layer resist suitable for a vapor deposition method and a lift-off method is used, for instance. This resist is applied on the whole surface, and openings from which the recesses 13 for electrodes are exposed are formed. Consequently, the resist mask having the openings is formed.

By using this resist mask, for example, Ni/Au are deposited as electrode materials by, for example, the vapor deposition method on the resist mask including the inside of the openings from which the recesses 11 for electrodes are exposed. A thickness of Ni is about 30 nm and a thickness of Au is about 400 nm. The resist mask and Ni/Au deposited thereon are removed by the lift-off method. Through these processes, the gate electrodes 14 filling the inside of the recesses 13 for electrodes and projecting above the second insulating film 5 are formed. The gate electrodes 14 are in Schottky contact with the cap layer 2e.

Thereafter, through steps such as the formation of wirings connected to source electrodes 6, drain electrodes 7, and the gate electrodes 14, the Schottky-type AlGaN/GaN HEMT according to this modification example is formed.

As described above, this modification example realizes a highly reliable Schottky-type AlGaN/GaN HEMT in which the first insulating film 3 being a protection film of a compound semiconductor stack structure 2 is formed to have excellent insulating film quality but the occurrence of an off-leakage current is surely inhibited, enabling a reduction in a loss at the power-off time.

The AlGaN/GaN HEMT of one kind selected from the first and second embodiments and the modification examples thereof is applied to what is called a discrete package.

In this discrete package, a chip of the AlGaN/GaN HEMT of one kind selected from the first and second embodiments and the modification examples thereof is mounted. Hereinafter, the discrete package of the chip of the AlGaN/GaN HEMT of one kind selected from the first and second embodiments and the modification examples thereof (hereinafter, referred to as a HEMT chip) will be exemplified.

Figure 24:
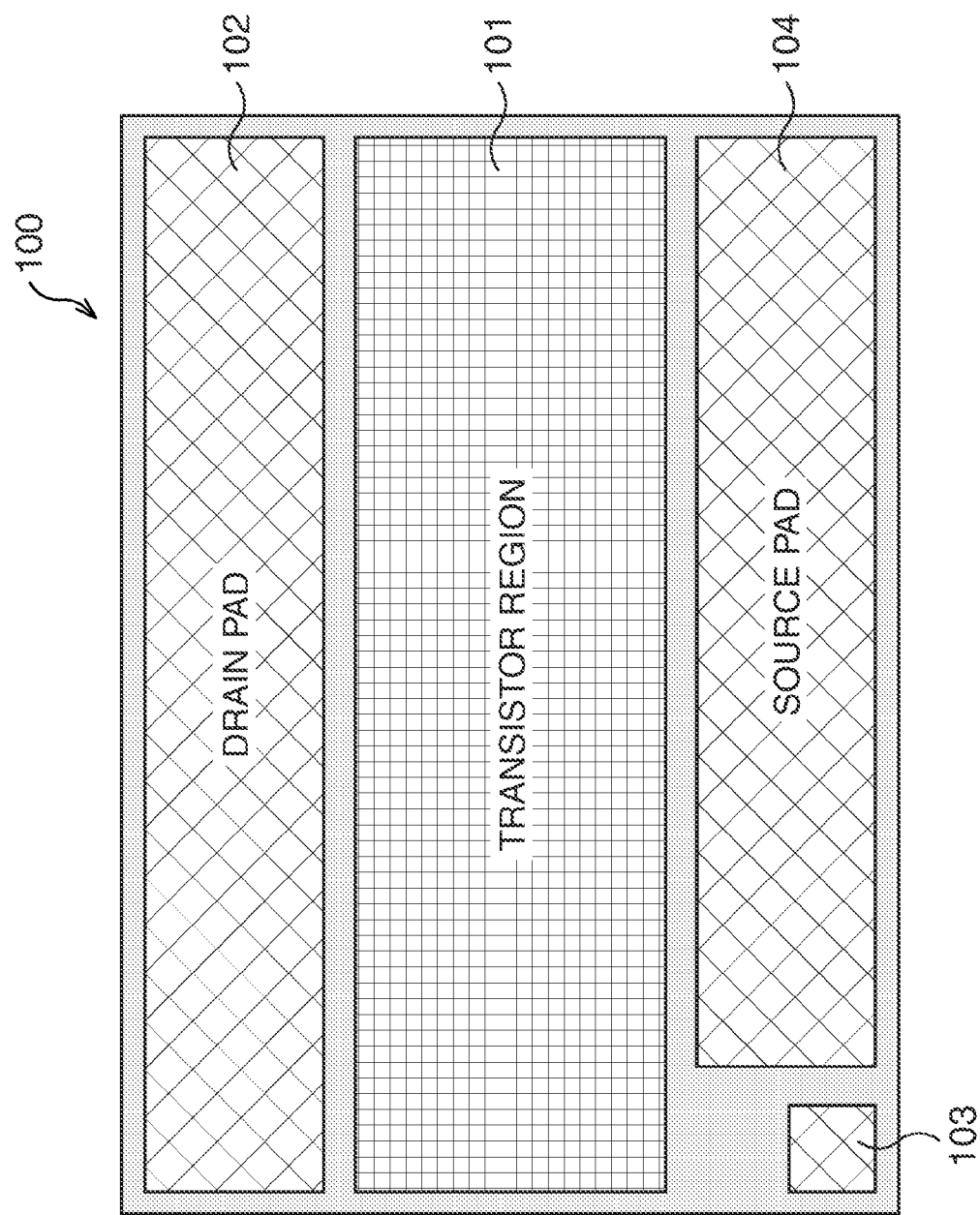
FIG. 24 is a schematic plane view illustrating a HEMT chip which uses the AlGaN/GaN HEMT of one kind selected from the first and second embodiments and the modification examples thereof.

A schematic structure of the HEMT chip will be illustrated in FIG. 24.

On a surface of the HEMT chip 100, there are provided a transistor region 101 of the above-described AlGaN/GaN HEMT, a drain pad 102 to which the drain electrode is connected, a gate pad 103 to which the gate electrode is connected, and a source pad 104 to which the source electrode is connected.

Figure 25:
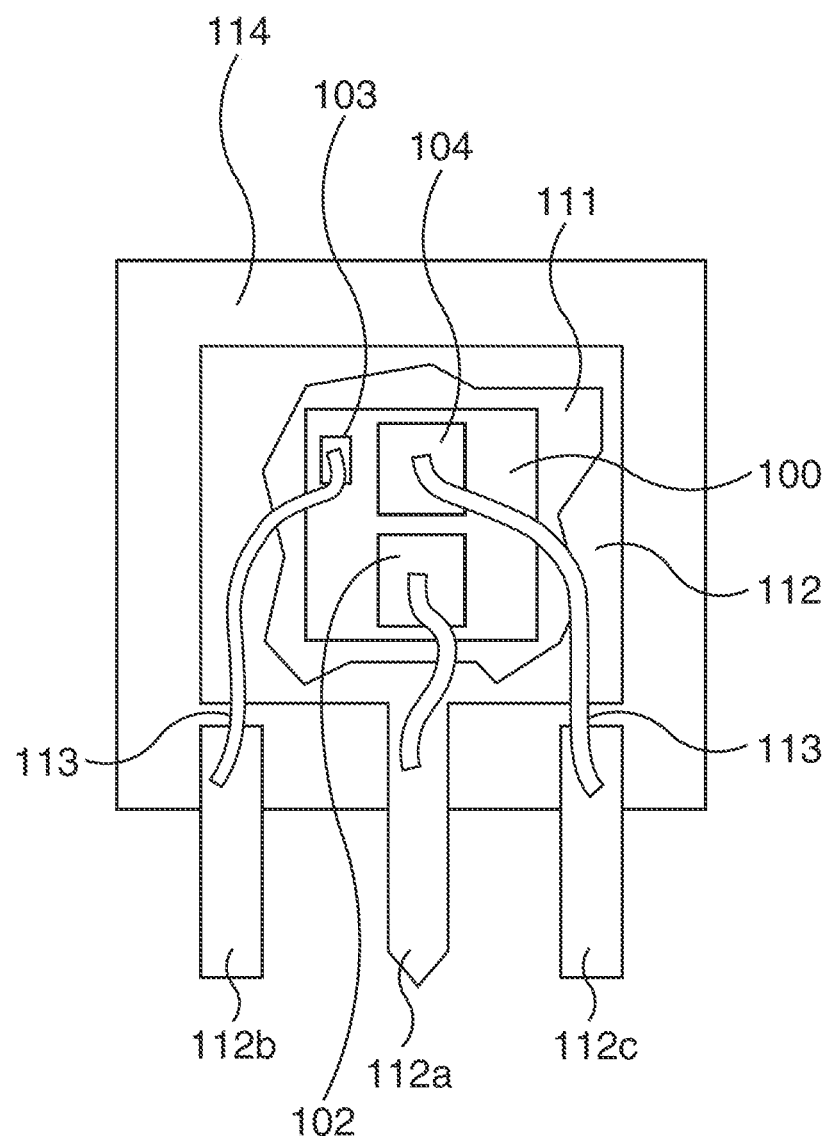
FIG. 25 is a schematic plane view illustrating a discrete package of a HEMT chip which uses the AlGaN/GaN HEMT of one kind selected from the first and second embodiments and the modification examples thereof.

FIG. 25 is a schematic plane view illustrating the discrete package.

To fabricate the discrete package, the HEMT chip 100 is first fixed to a lead frame 112 by using a die attach agent 111 such as solder. A drain lead 112a is integrally formed with the lead frame 112, and a gate lead 112b and a source lead 112c are arranged apart from each other as separate structures from the lead frame 112.

Subsequently, by bonding using Al wires 113, the drain pad 102 and the drain lead 112a, the gate pad 103 and the gate lead 112b, and the source pad 104 and the source lead 112c are electrically connected.

Thereafter, by using mold resin 114, the HEMT chip 100 is resin-sealed by a transfer mold method and the lead frame 112 is separated. Through the above processes, the discrete package is formed.

Third Embodiment

In this embodiment, a PFC (Power Factor Correction) circuit including the AlGaN/GaN HEMT of one kind selected from the first and second embodiments and the modification examples thereof will be disclosed.

Figure 26:
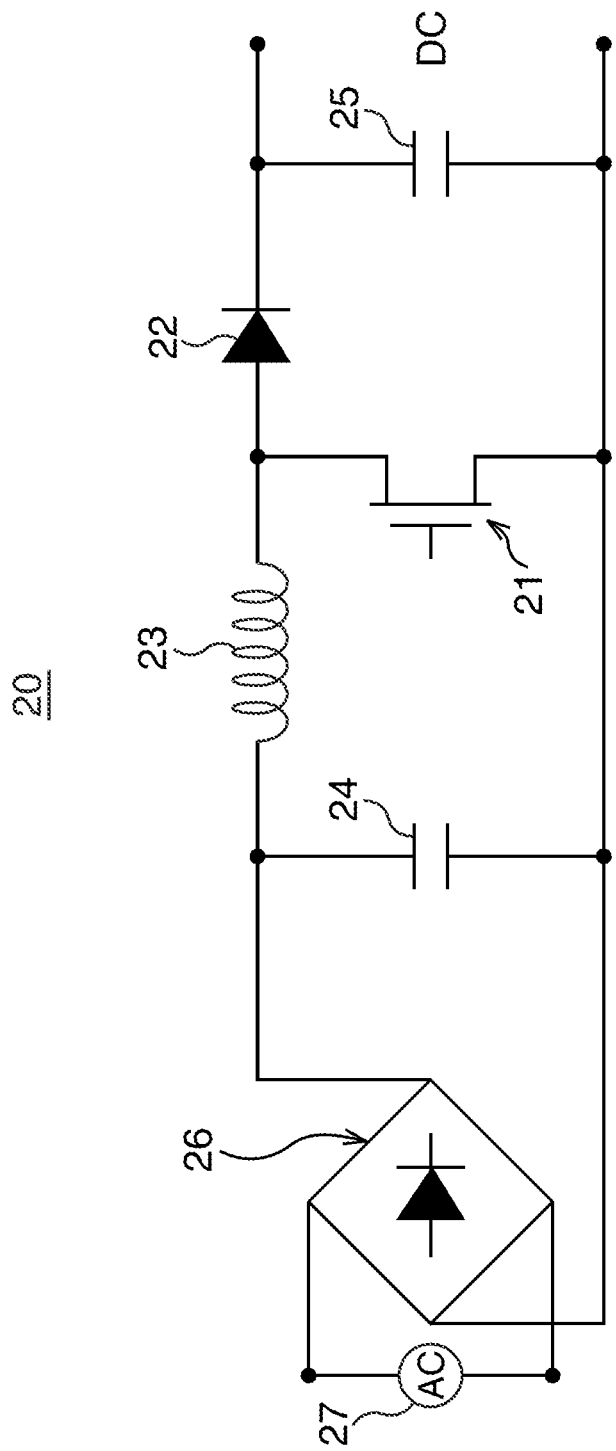
FIG. 26 is a connection diagram illustrating a PFC circuit according to a third embodiment.

FIG. 26 is a connection diagram illustrating the PFC circuit.

The PFC circuit 20 includes a switch element (transistor) 21, a diode 22, a choke coil 23, capacitors 24, 25, a diode bridge 26, and an AC power source (AC) 27. The AlGaN/GaN HEMT of one kind selected from the first and second embodiments and the modification examples thereof is applied as the switch element 21.

In the PFC circuit 20, a drain electrode of the switch element 21 is connected to an anode terminal of the diode 22 and one terminal of the choke coil 23. A source electrode of the switch element 21 is connected to one terminal of the capacitor 24 and one terminal of the capacitor 25. The other terminal of the capacitor 24 and the other terminal of the choke coil 23 are connected to each other. The other terminal of the capacitor 25 and a cathode terminal of the diode 22 are connected to each other. Between the both terminals of the capacitor 24, the AC 27 is connected via the diode bridge 26. Between the both terminals of the capacitor 25, a DC power source (DC) is connected. Incidentally, a not-shown PFC controller is connected to the switch element 21.

Regarding the PFC circuit 30, its operating efficiency was studied based on the comparison with a PFC circuit including the AlGaN/GaN HEMT of the comparative example illustrated in FIG. 13. The PFC circuit of the comparative example and the PFC circuit 30 are operated under a 200 V input voltage, a 48 V output voltage, and 100 kHz. As a result, the efficiency was about 95% in the PFC circuit of the comparative example. On the other hand, in the PFC circuit 30, the efficiency was about 97.5%, and it has been confirmed that a loss is reduced to half.

In this embodiment, the AlGaN/GaN HEMT of one kind selected from the first and second embodiments and the modification examples thereof is applied to the PFC circuit 20. Consequently, the PFC circuit 30 having high reliability is realized.

Fourth Embodiment

In this embodiment, a power supply device including the AlGaN/GaN HEMT of one kind selected from the first and second embodiments and the modification examples thereof will be disclosed.

Figure 27:
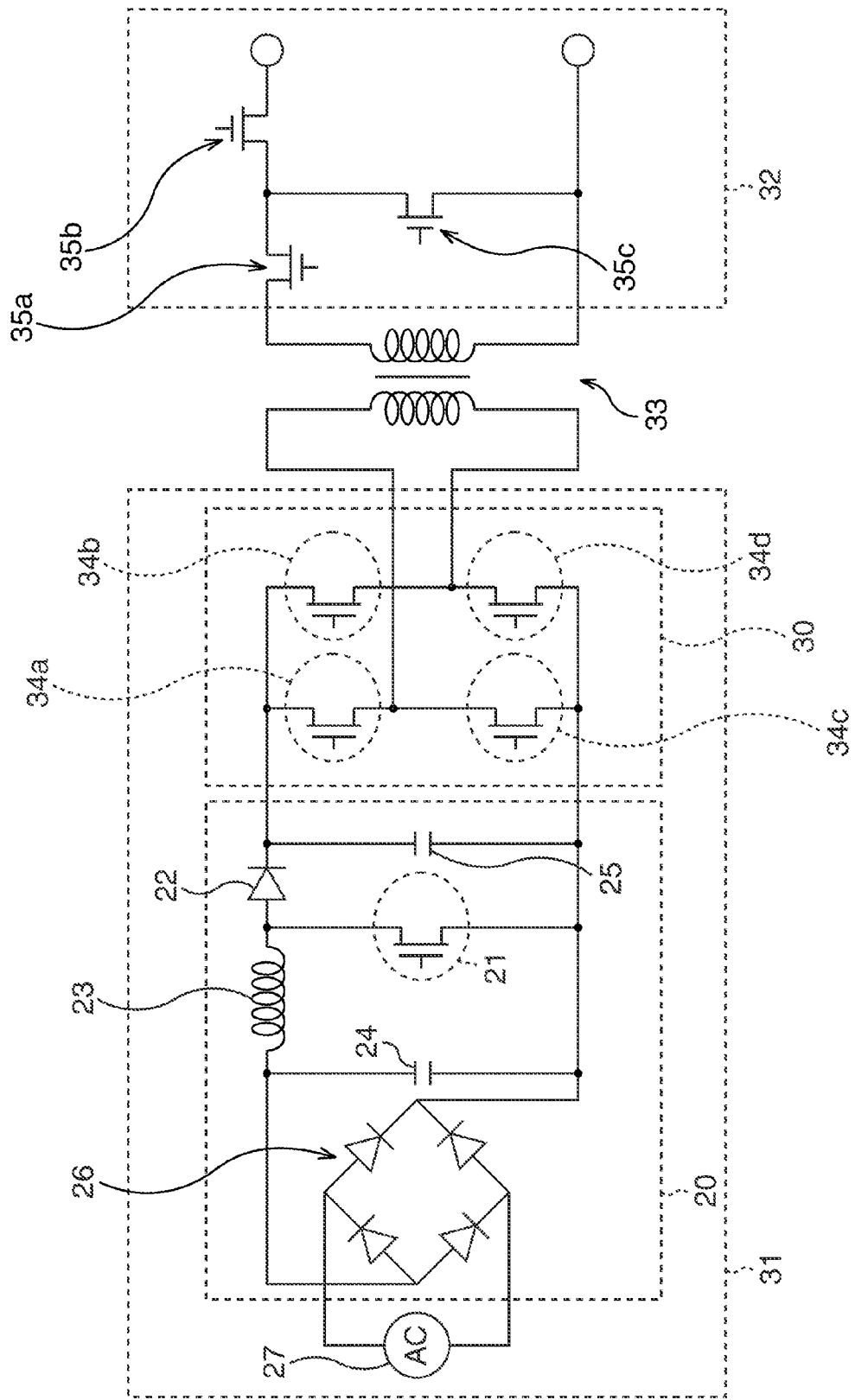
FIG. 27 is a connection diagram illustrating a schematic structure of a power supply device according to a fourth embodiment.

FIG. 27 is a connection diagram illustrating a schematic structure of the power supply device according to the fourth embodiment.

The power supply device according to this embodiment includes a high-voltage primary-side circuit 31, a low-voltage secondary-side circuit 32, and a transformer 33 disposed between the primary-side circuit 31 and the secondary-side circuit 32.

The primary-side circuit 31 includes the PFC circuit 20 according to the third embodiment and an inverter circuit, for example, a full bridge inverter circuit 30 connected between the both terminals of the capacitor 25 of the PFC circuit 20.

The full bridge inverter circuit 30 includes a plurality of (four here) switch elements 34a, 34b, 34c, 34d.

The secondary-side circuit 32 includes a plurality of (three here) switch elements 35a, 35b, 35c.

In this embodiment, the PFC circuit included in the primary-side circuit 31 is the PFC circuit 20 according to the third embodiment, and the switch elements 34a, 34b, 34c, 34d of the full bridge inverter circuit 30 are each the AlGaN/GaN HEMT of one kind selected from the first and second embodiments and the modification examples thereof. On the other hand, the switch elements 35a, 35b, 35c of the secondary-side circuit 32 are each a normal MIS FET using silicon.

In this embodiment, the PFC circuit 20 according to the third embodiment and the AlGaN/GaN HEMT of one kind selected from the first and second embodiments and the modification examples thereof are applied to the primary-side circuit 31 being the high-voltage circuit. Consequently, a highly reliable, high-output power supply device is realized.

Fifth Embodiment

In this embodiment, a high-frequency amplifier including the AlGaN/GaN HEMT of one kind selected from the first and second embodiments and the modification examples thereof will be disclosed.

FIG. 28 is a connection diagram illustrating a schematic structure of the high-frequency amplifier according to the fifth embodiment.

The high-frequency amplifier according to this embodiment includes a digital predistortion circuit 41, mixers 42a, 42b, and a power amplifier 43.

The digital predistortion circuit 41 compensates a nonlinear distortion of an input signal. The mixer 42a mixes the input signal whose nonlinear distortion is compensated with an AC signal. The power amplifier 43 amplifies the input signal mixed with the AC signal and has the AlGaN/GaN HEMT of one kind selected from the first and second embodiments and the modification examples thereof. Incidentally, in FIG. 28, for example, changeover of a switch enables the mixer 42b to mix an output-side signal with an AC signal to send the resultant to the digital predistortion circuit 41.

In this embodiment, the AlGaN/GaN HEMT of one kind selected from the first and second embodiments and the modification examples thereof is applied to the high-frequency amplifier. Consequently, a high-frequency amplifier high in reliability and high in withstand voltage is realized.

Other Embodiments

In the first and second embodiments and the modification examples thereof, the AlGaN/GaN HEMTs are exemplified as the compound semiconductor device. The compound semiconductor device is applicable to the following HEMTs in addition to the AlGaN/GaN HEMT.

Example 1 of Other Device

In this example, as the compound semiconductor device, an InAlN/GaN HEMT will be disclosed.

InAlN and GaN are compound semiconductors whose lattice constants can be made close to each other by their compositions. In this case, in the above-described first and second embodiments and the modification examples thereof, the electron transit layer is formed of i-GaN, the intermediate layer is formed of AlN, the electron supply layer is formed of n-InAlN, and the first and third caps of the cap layer are formed of n-GaN. Further, since almost no piezoelectric polarization occurs in this case, two-dimensional electron gas is mainly generated by spontaneous polarization of InAlN.

Similarly to the above-described AlGaN/GaN HEMT, this example realizes a highly reliable InAlN/GaN HEMT in which a protection film (first insulating film) is formed to have excellent insulating film quality but the occurrence of an off-leakage current is surely inhibited, enabling a reduction in a loss at the power-off time.

Example 2 of Other Device

In this example, as the compound semiconductor device, an InAlGaN/GaN HEMT will be disclosed.

GaN and InAlGaN are compound semiconductors whose lattice constants can be adjusted by their compositions so that the lattice constant of the latter becomes smaller than the lattice constant of the former. In this case, in the above-described first and second embodiments and the modification examples thereof, the electron transit layer is formed of i-GaN, the intermediate layer is formed of i-InAlGaN, the electron supply layer is formed of n-InAlGaN, and the first and third caps of the cap layer are formed of n-GaN.

Similarly to the above-described AlGaN/GaN HEMT, this example realizes a highly reliable InAlGaN/GaN HEMT in which a protection film (first insulating film) is formed to have excellent insulating film quality but the occurrence of an off-leakage current is surely inhibited, enabling a reduction in a loss at the power-off time.

The above-described embodiments each realize a highly reliable compound semiconductor device in which a protection film is formed to have excellent insulating film quality but the occurrence of an off-leakage current is surely inhibited, enabling a reduction in a loss at the power-off time.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
   a nitride semiconductor region;
   an element isolation structure which demarcates an element region by an insulating material on the nitride semiconductor region;
   a first insulating film which is formed on the element region and is not formed on the element isolation structure; and
   a second insulating film which is formed on at least the insulating material of the element isolation structure and is higher in hydrogen content than the first insulating film.

2. The compound semiconductor device according to claim 1, wherein the hydrogen content of the first insulating film is 1% or less, and the hydrogen content of the second insulating film is 1% or more.

3. The compound semiconductor device according to claim 1, wherein the first insulating film and the second insulating film are each made of a material of aluminum oxide, hafnium oxide, aluminum oxynitride, or tantalum oxide or any combination thereof.

4. The compound semiconductor device according to claim 1, further comprising an electrode at least part of which is formed on the first insulating film in the element region.

5. The compound semiconductor device according to claim 4, wherein the electrode is formed above the nitride semiconductor region in the element region, via the first insulating film.

6. The compound semiconductor device according to claim 4, wherein the electrode is in contact with the compound semiconductor region in the element region via an opening formed in the first insulating film.

7. A power supply device comprising:
 a transformer; and
 a high-voltage circuit and a low-voltage circuit that sandwich the transformer, the high-voltage circuit including a transistor; the transistor including:
  a compound semiconductor region;
  an element isolation structure which demarcates an element region by an insulating material on the compound semiconductor region;
  a first insulating film which is formed on the element region and is not formed on the element isolation structure; and
  a second insulating film which is formed on at least the insulating material of the element isolation structure and is higher in hydrogen content than the first insulating film.

* * * * *